US012731762B2

(12) United States Patent
Moses et al.

(10) Patent No.: US 12,731,762 B2
(45) Date of Patent: Sep. 8, 2026

(54) METHOD FOR PLASMA PROCESSING

(71) Applicant: Tokyo Electron Limited, Tokyo (JP)

(72) Inventors: Justin Moses, Austin, TX (US); Merritt Funk, Austin, TX (US); Chelsea DuBose, Austin, TX (US); Barton Lane, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 425 days.

(21) Appl. No.: 18/453,875

(22) Filed: Aug. 22, 2023

(65) Prior Publication Data

US 2025/0069852 A1 Feb. 27, 2025

(51) Int. Cl.
*H01J 37/32* (2006.01)
*H10P 50/28* (2026.01)

(52) U.S. Cl.
CPC ...... *H01J 37/32165* (2013.01); *H10P 50/283* (2026.01); *H01J 2237/327* (2013.01)

(58) Field of Classification Search
CPC .......... H01J 37/32165; H01J 2237/327; H01L 21/31116
See application file for complete search history.

(56) References Cited

U.S. PATENT DOCUMENTS 7,431,857 B2 10/2008 Shannon et al.
8,404,598 B2 3/2013 Liao et al.
10,510,512 B2 12/2019 Funk et al.
2004/0035837 A1 2/2004 Mitrovic et al.
2006/0021970 A1 2/2006 Parsons
2007/0245959 A1 10/2007 Paterson et al.
2010/0210078 A1* 8/2010 Miyairi ............. H01L 21/76254 438/22
2012/0018096 A1* 1/2012 Gesche ............. H01J 37/32082 204/298.34
2012/0024963 A1* 2/2012 Shionoiri ............... H10D 86/80 257/E21.409
2019/0385822 A1 12/2019 Marakhtanov et al.
2022/0102141 A1 3/2022 Singh et al.
2023/0178336 A1 6/2023 Rogers et al.
2023/0207294 A1 6/2023 Jin et al.
2023/0230804 A1 7/2023 Bhowmick et al.

FOREIGN PATENT DOCUMENTS

JP 2010212670 A * 9/2010 ............. H10D 86/60
KR 20230100087 A 7/2023
WO 2023081110 A1 5/2023

OTHER PUBLICATIONS

International Searching Authority, "Notification of Transmittal of The International Search Report and The Written Opinion of The International Searching Authority, or The Declaration," PCT/US2024/036718, Date of mailing Oct. 14, 2024, 9 pages.

* cited by examiner

*Primary Examiner* — Abdullah A Riyami
*Assistant Examiner* — Syed M Kaiser
(74) *Attorney, Agent, or Firm* — Slater Matsil, LLP

(57) ABSTRACT

A method for multitone plasma processing includes providing a substrate into a plasma processing chamber, igniting a plasma in the plasma processing chamber with a multitone signal, and performing a first plasma process on the substrate with the plasma. The multitone signal includes a first tone and a second tone.

20 Claims, 20 Drawing Sheets

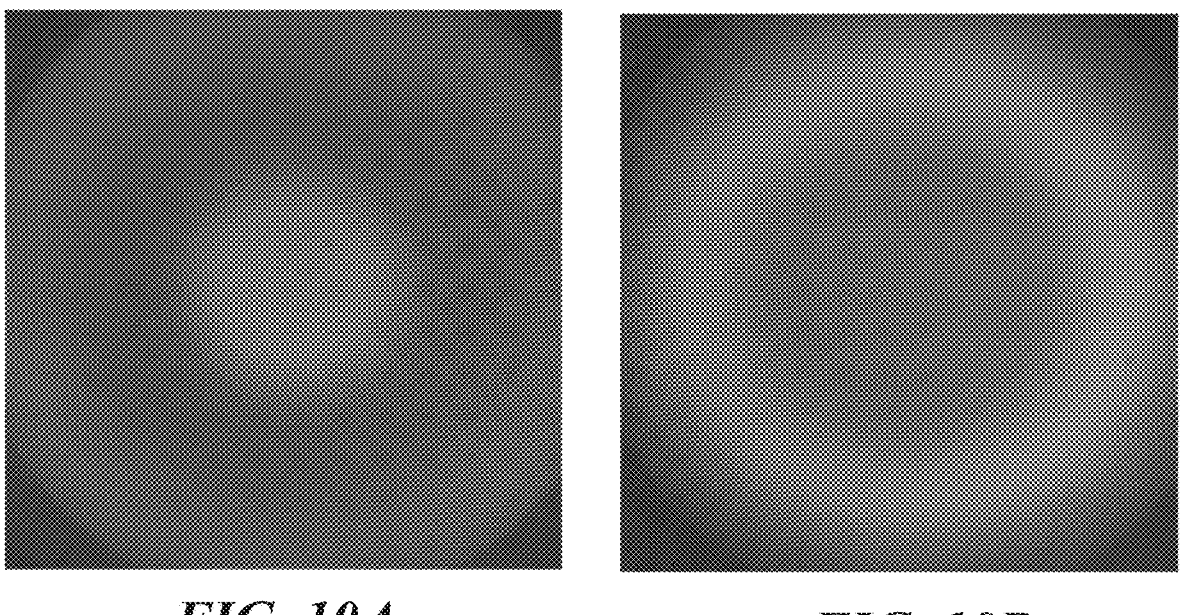
FIG. 10A
FIG. 10B
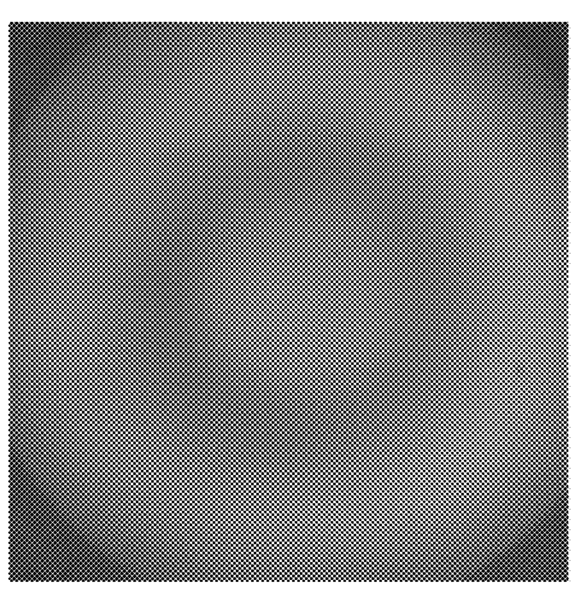
FIG. 10C

Amplitude
602
Frequency
Antenna 1
Antenna 2

Amplitude
604
Frequency
Antenna 1
Antenna 2

Amplitude
606
Frequency
Antenna 1
Antenna 2

702
Amplitude
Frequency
Antenna 1
Antenna 2

704
Amplitude
Frequency
Antenna 1
Antenna 2

706
Amplitude
Frequency
Antenna 1
Antenna 2

METHOD FOR PLASMA PROCESSING

TECHNICAL FIELD

The present disclosure generally relates to substrate processing and, in particular embodiments, to methods and systems for plasma processing.

BACKGROUND

Plasma processing systems are used for etching substrates to form microelectronic or micromechanical devices. In a plasma processing system, an electromagnetic wave radiated into a plasma chamber generates an electromagnetic field within the chamber. The generated electromagnetic field heats electrons in the chamber. The heated electrons ignite a plasma that treats the substrate in a process such as for etching, deposit, oxidation, sputtering, or the like.

Plasma processes such as reactive ion etching (RIE), plasma-enhanced CVD (PECVD), plasma-enhanced atomic layer etch and deposition (PEALE and PEALD), and cyclic plasma process (e.g., cycles of alternating deposition and etch) are routinely used in the deposition and patterning steps used in semiconductor IC fabrication. The challenge of providing manufacturable plasma technology for advanced IC designs, however, has intensified with the advent of feature sizes scaled down to a few nanometers with structural features controlled at atomic scale dimensions. A manufacturable plasma process is expected to provide structures with precise dimensions (e.g., linewidths, etch depth, and film thicknesses) along with precisely controlled features for both plasma etch (e.g., sidewall angle, anisotropy, and selectivity to etch-stop layers) and plasma deposition (e.g., conformality, aspect-ratio selectivity, and area selectivity for bottom-up patterning), and uniformity across a wide (e.g., 300 mm) wafer. In many of the plasma processes used in IC manufacturing, the plasma is sustained by RF power. Fast and repeatable plasma ignition and stable power delivery are desirable for achieving precise control of plasma processes.

SUMMARY

In accordance with an embodiment, a method for multitone plasma processing includes: providing a substrate into a plasma processing chamber; igniting a plasma in the plasma processing chamber with a multitone signal, the multitone signal including a first tone and a second tone, at least the first tone having a frequency that is not a fundamental frequency of the multitone signal nor a frequency of a harmonic of the fundamental frequency; and performing a plasma process on the substrate with the plasma, the plasma having a first resonant frequency, where a width in frequency between the first tone and the fundamental frequency is less than 1% to 99% of the fundamental frequency.

In accordance with another embodiment, a method for multitone plasma processing includes: providing a multitone signal to an antenna system including a first resonance and a second resonance, where the multitone signal includes a first tone driving the first resonance and a second tone driving the second resonance; igniting a plasma in a plasma chamber with the antenna system; and performing a plasma process in the plasma chamber.

In accordance with yet another embodiment, a method for multitone tuning includes: lighting a plasma in a plasma processing system with a multitone signal; controlling a fundamental frequency of the multitone signal; monitoring a full bandwidth of a feedback signal of the plasma processing system; shifting the fundamental frequency in response to analysis of the feedback signal; and after determining that the fundamental frequency is at a desired frequency, maintaining the fundamental frequency of the multitone signal while set conditions of the plasma are unchanged and monitoring the feedback signal for changes.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 9A-9C, 10A-10D, 11A-11C, and 12A-12C illustrate various graphs and images relating to using multitone signals to control multiple antennas, in accordance with some embodiments;

Figure 1:
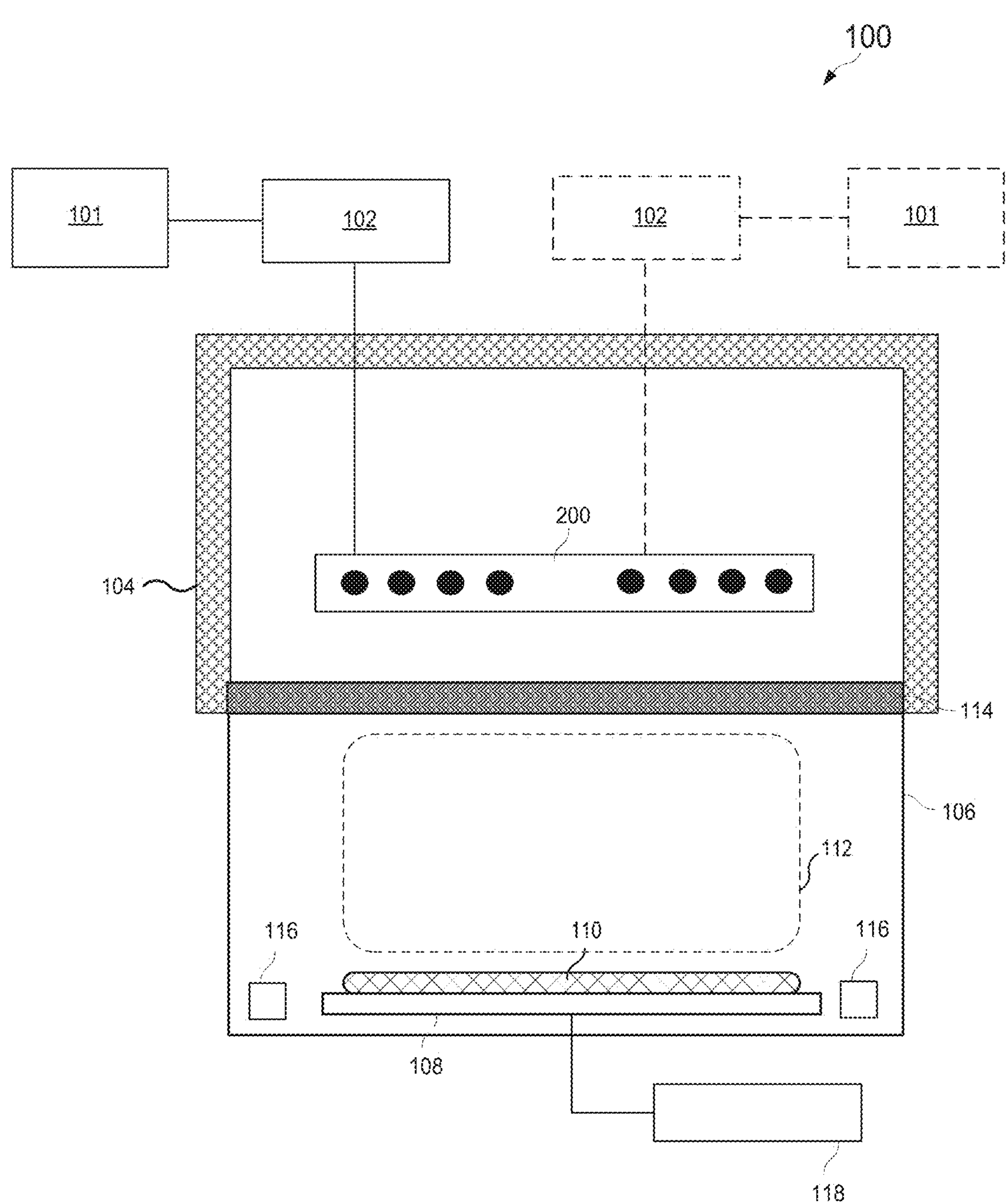
FIG. 1 illustrates a diagram of a plasma processing system, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

While inventive aspects are described primarily in the context of a plasma processing system for semiconductor manufacturing, the inventive aspects may be similarly applicable to fields outside the semiconductor industry. Plasma can be used to treat and modify surface properties through functional group addition. For example, to treat surfaces for paint deposit, plasma can convert hydrophobic surfaces to hydrophilic surfaces. Further, the inventive aspects are not limited to plasma. For example, RF can be used to thaw out frozen food or dry out textiles, food, wood, or the like. In these various examples and across industries, a uniformly generated plasma as disclosed herein is advantageous.

According to one or more embodiments of the present disclosure, this application relates to methods and systems for igniting and controlling plasmas with multitone tuning. Using traditional antennas and traditional tuning of a single frequency (also referred to as single-tone tuning) to ignite plasma and sustain the lit plasma may be difficult to achieve due to various pitfalls arising from single-tone tuning. Resonant systems have an associated resonant frequency. In plasma systems, plasma conditions may affect the resonant frequency. Although the generated RF frequency used to drive the plasma does not drift, the resonant frequency targeted by the generated RF frequency may drift with changing plasma conditions. Because of this, the resonant frequency may be fluid and unknown. As such, a multitone tuning scheme which can cover a range of frequencies is advantageous.

For example, one of the largest drawbacks of single-tone tuning is that when a single frequency is tuned to the lowest reflected power, it may sit on a frequency cliff. Slight changes or drifts in plasma conditions may occur faster than an autotuner can compensate for by adjusting the frequency. The plasma processing system in operation may have a resonant frequency (or multiple resonant frequencies) that depends on the one or more antenna(s) (also referred to as coil(s)), the plasma itself and its changing conditions, and any other structures that may influence the resonant frequency. The changes or drifts in plasma conditions can push the resonant frequency of the antenna (together with the plasma) away from the generated frequency and over the tuning cliff, which can extinguish the plasma and cause instabilities. This is caused because the optimal tuning frequency depends on the density and spatial profile of the plasma. The spatial profile of the plasma can change at a time scale that is faster than the autotuner can update.

Using multitone signals instead of a single frequency helps eliminate the frequency cliffs to make tuning easier and more forgiving. The multitone signals spread power over a band of frequencies instead of just a single frequency. If the fundamental frequency is tuned to reduce reflected power and the resonance shifts, power will still be in tune even if the original frequency is off the tuning cliff. Multitone signals can be used to light multiple antennas at once for uniformity control or account for antenna-antenna variations. Embodiments of this disclosure encompass multitone signals including two individual frequencies up to any desired number of frequencies. These multitone signals can be, e.g., two frequencies that are far apart, a thousand or more frequencies that are within a desired frequency band, or any suitable number or distribution of frequencies.

Embodiments of the disclosure are described in the context of the accompanying drawings. An embodiment of a plasma processing system will be described using FIG. 1. Embodiments of antennas for plasma processing systems will be described using FIGS. 2-3. Experimental results of multitone tuning will be described using FIGS. 5-6. Embodiments of multitone signals will be described using FIGS. 7A, 7B, and 8A-8C. Embodiments of using multitone signals to control multiple antennas will be described using FIGS. 9A-9C, 10A-10D, 11A-11C, and 12A-12C. Embodiments of methods for multitone tuning will be described using FIGS. 13-14. An embodiment of a method for multitone plasma processing will be described using FIG. 15. An embodiment of another method for multitone plasma processing will be described using FIG. 16.

FIG. 1 illustrates a diagram of an embodiment plasma processing system 100, in accordance with some embodiments. Plasma processing system 100 includes a matching circuit 102, an antenna 200, a housing structure 104, a plasma processing chamber 106, and, optionally, a dielectric plate 114, which may (or may not) be arranged as illustrated in FIG. 1. Further, plasma processing system 100 may include additional components not depicted in FIG. 1.

In various embodiments, antenna 200 is coupled to an RF source 101 through a matching circuit 102. RF source 101 includes an RF power supply, which may include a generator circuit. RF source 101 provides forward RF waves to antenna 200, which are radiated towards plasma processing chamber 106. Throughout the description, the RF source 101 may be alternatively referred to as a power supply or RF source.

RF source 101 is coupled to matching circuit 102 and matching circuit 102 is coupled to antenna 200 via power transmission lines, such as coaxial cables or the like. The RF source 101 may be employed to provide RF power to the antenna 200 as a continuous wave (CW) or as pulses. In an embodiment, the RF source 101 may be employed to provide pulse-modulated RF power to the antenna 200. The RF source 101 may provide pulse-modulated RF power to the antenna 200 at a modulation frequency that is in a range from 10 Hz to more than 1000 kHz. In addition, the RF source 101 may provide pulse-modulated RF power to the antenna 200 at a duty cycle that is in a range from less than 1 percent to 99 percent.

In some embodiments, one or more additional RF source(s) 101 are coupled to the antenna 200 through one or more respective matching circuit(s) 102. The antenna 200 may comprise one or more antennas, each of which is coupled to a respective RF source 101. In other embodiments, one or more antennas 200 are coupled to the same RF source 101.

In some embodiments, RF source 101 includes a VI sensor (also referred to as a current-voltage (IV) probe). The VI sensor may provide feedback on power and impedance matching to a controller. The VI sensor may include a current sensor and a voltage sensor. In some embodiments, the VI sensor has broadband capability, such as over a frequency range of 0.307 MHz to 252 MHz. However, any suitable VI sensor may be used, such as a VI sensor without broadband capability.

An impedance associated with the plasma generated in the plasma processing chamber 106 corresponds to the load of the antenna 200 during its operation. The impedance of the plasma can vary based on, for example, changes in pressure, temperature, or operating conditions. Typically, a matching circuit (auto or manual) coupled to the radiating antenna is used to minimize losses (i.e., reflected power) in response to changes in the load condition. The matching circuit 102 (also referred to as a matching network or an impedance matching network) is coupled between the RF source 101 and the antenna 200. As forward power propagates from the RF source 101 to the antenna 200, some reflected power may be reflected back due to impedance mismatch between the plasma processing chamber 106 and the RF source 101. The matching circuit 102 is used to reduce reflected power by transforming the impedance looking into the matching circuit 102 (in other words, the impedance of the transmission lines, plasma process chamber 106, and antenna 200) to a same impedance as the RF source 101 and any intermediate transmission lines. This increases the efficiency of supplying power to the plasma processing chamber 106.

Plasma processing chamber 106 may be, e.g., a medium frequency (MF) or high frequency (HF) plasma chamber. The plasma processing chamber 106 may be a vacuum chamber. In some embodiments, the plasma processing chamber 106 is configured to operate plasma at a first resonant frequency, wherein the first resonant frequency is in a range from about 1 MHz to about 27 MHz. For example, the plasma processing chamber 106 may be configured to operate plasma at 1 MHz or more, 13.56 MHz or more, 27 MHz or more, or the like.

In various embodiments, plasma processing chamber 106 includes a substrate holder 108 (e.g., a chuck). As illustrated, substrate 110 is placed on substrate holder 108 to be processed. Optionally, plasma processing chamber 106 may include a bias power supply 118 coupled to substrate holder 108. The plasma processing chamber 106 may also include one or more pump outlets 116 to remove by-products from plasma processing chamber 106 through selective control of gas flow rates within. In various embodiments, pump outlets 116 are placed near (e.g., below/around the perimeter of) substrate holder 108 and substrate 110. In various embodiments, plasma processing chamber 106 may include additional substrate holders (not illustrated). In various embodiments, the placement of the substrate holder 108 may differ from that illustrated in FIG. 1. Thus, the quantity and position of the substrate holder 108 are non-limiting.

In various embodiments, antenna 200 radiates an electromagnetic field toward the plasma processing chamber 106. The radiated electromagnetic field generates an azimuthally symmetric, high-density plasma within a plasma generating region 112 with low capacitively coupled electric fields. In various embodiments, antenna 200 is an inductively coupled antenna, such as a planar coil wound in a flat helix (i.e., a stovetop antenna). In an embodiment, antenna 200 includes arms connected to capacitive structures that generate the azimuthal symmetry. In various embodiments, the excitation frequency of the antenna 200 is in the radio frequency range (10-400 MHz), which is not limiting, and other frequency ranges can similarly be contemplated. For example, inventive aspects disclosed herein equally apply to applications in the microwave frequency range.

In various embodiments, antenna 200 includes resonant elements. The resonant elements can be arms that are electrically connected to capacitive structures. The arms and the capacitive structures are resonant with electromagnetic waves fed from the RF source 101.

In various embodiments, resonant elements sustain standing electromagnetic waves. The resonant elements are placed close to and parallel to the dielectric plate 114 such that the oscillating magnetic field from the resonant elements penetrates the plasma processing chamber 106. The time-varying magnetic field induces a time-varying electric field, which transfers energy to plasma electrons.

In various embodiments, the RF source 101 couples energy to an interface of the antenna 200 to generate the standing electromagnetic waves from the antenna 200. The RF source 101 is coupled to the interface via a transmission line in embodiments. It is desirable that the interface maintain the same or higher symmetry as the elements of antenna 200 under rotation about the axis of symmetry.

Additionally illustrated is housing structure 104, which surrounds antenna 200. Housing structure 104 is a conductive structure, which is electrically coupled to the RF ground of RF source 101 and, thus, RF grounded. In various embodiments, housing structure 104 includes openings to couple an RF feed path from RF source 101 to antenna 200 and to couple antenna 200 to a ground terminal.

In various embodiments, housing structure 104 is positioned adjacent to the top of the plasma processing chamber 106, such that dielectric plate 114 is sandwiched between housing structure 104 and plasma processing chamber 106. The antenna 200, thus, generates electromagnetic waves that radiate through the dielectric plate 114 toward the plasma processing chamber 106.

In various embodiments, antenna 200 is outside of plasma processing chamber 106 and is separated from plasma processing chamber 106 by the dielectric plate 114, which is typically made of a dielectric material. Dielectric plate 114 separates the low-pressure environment within plasma processing chamber 106 from the external atmosphere. It should be appreciated that antenna 200 can be placed directly adjacent to dielectric plate 114. In various embodiments, antenna 200 is separated from plasma processing chamber 106 by air. In various embodiments, the properties of the dielectric plate 114 are selected to minimize reflections of the RF wave from the plasma processing chamber 106. In other embodiments, antenna 200 is embedded within the dielectric plate 114. In various embodiments, dielectric plate 114 is in the shape of a disk.

The dielectric plate 114 includes a first outer surface and a second outer surface. The first outer surface faces the plasma processing chamber 106. The second outer surface faces the antenna 200. The second outer surface is above the first outer surface in a vertical direction. In some cases, the two surfaces may be in a different orientation.

In an embodiment, the antenna 200 couples RF power from RF source 101 to the plasma processing chamber 106 to treat substrate 110. The antenna 200 may have a single resonance or two or more resonances. In particular, antenna 200 radiates an electromagnetic wave in response to being fed the forward RF waves from RF source 101. The radiated electromagnetic wave penetrates from the atmospheric side (i.e., antenna 200 side) of the dielectric plate 114 into plasma processing chamber 106. The radiated electromagnetic wave generates an electromagnetic field within the plasma processing chamber 106. The generated electromagnetic field ignites and sustains plasma in a plasma generating region 112 by transferring energy to free electrons within the plasma processing chamber 106. The generated plasma can be used for a plasma process to, for example, selectively etch or deposit material on substrate 110. The plasma process may include an etch process such as a Reactive Ion Etch (RIE) process, an Atomic Layer Etch (ALE) process or the like, a deposition process such as a Plasma-Enhanced Physical Vapor Deposition (PVD) process, a Plasma-Enhanced Chemical Vapor Deposition (CVD) process, an Atomic Layer Deposition (ALD) process or the like.

In various embodiments, the plasma generating region 112 is immediately below the nearest portion of the dielectric plate 114 to the plasma processing chamber 106. In various embodiments, the upper most surface of the plasma generating region 112 corresponds to the plane where the outer surface of the dielectric plate 114 faces the plasma processing chamber 106.

In FIG. 1, antenna 200 is external to plasma processing chamber 106. In various embodiments, however, antenna 200 can be placed internal to the plasma processing chamber 106. In such an embodiment, the plasma generating region 112 is immediately below the nearest portion of the antenna 200 to the plasma processing chamber 106.

Figure 2:
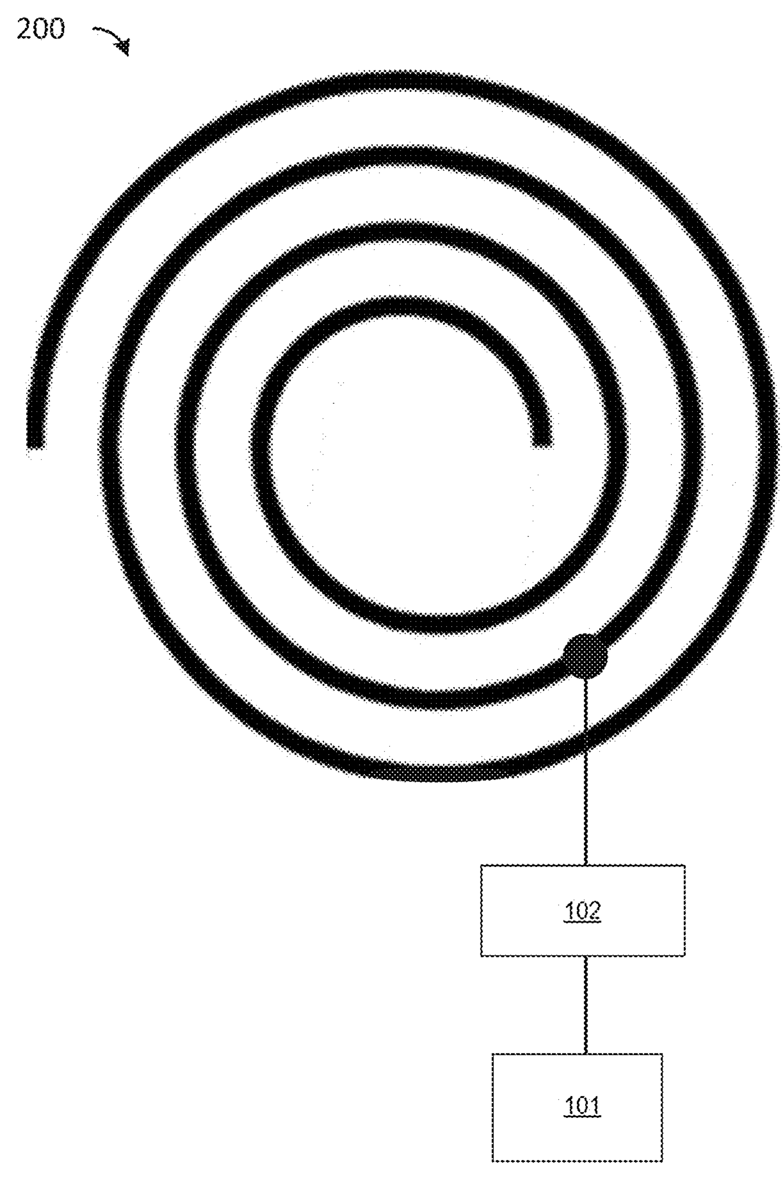
FIG. 2 illustrates a diagram of an antenna, in accordance with some embodiments.

FIG. 2 illustrates an example antenna 200, in accordance with some embodiments. The antenna 200 is a planar coil which is designed to be a half-wave dipole antenna, with the total length of the antenna 200 being equal to a half-wavelength at the frequency of operation (e.g., the first resonant frequency). As an example, the antenna 200 may be a flat coil antenna or stovetop antenna made of a conductive material, e.g., a coil of copper tubing. However, any suitable materials and shape may be used for the antenna 200. Because of the inclusion of the antenna 200, the plasma processing system 100 may also be referred to as an antenna system. The RF source 101 may be coupled to the antenna 200 (e.g., through the matching circuit 102).

Figure 3:
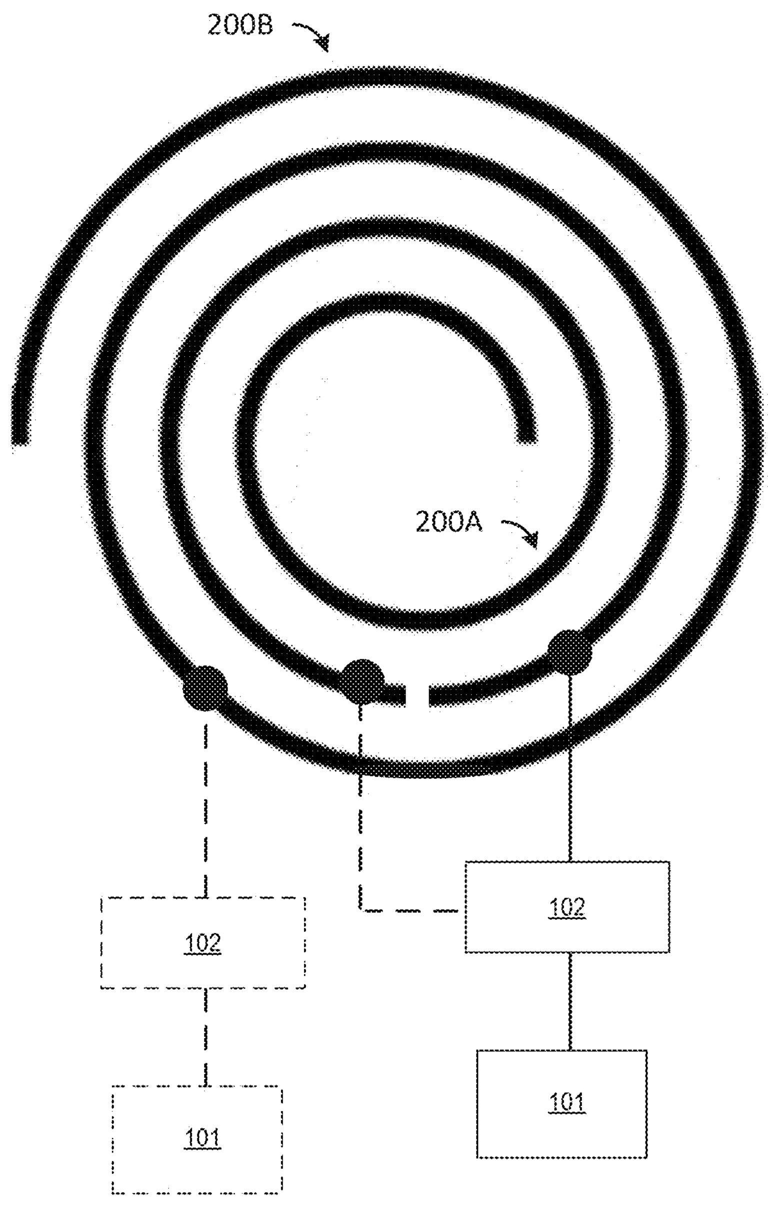
FIG. 3 illustrates a diagram of two antennas, in accordance with some embodiments.

FIG. 3 illustrates two example antennas 200A and 200B, in accordance with some embodiments. Antennas 200A and 200B are planar coils similar to antenna 200 (see above, FIG. 2). Antenna 200B surrounds antenna 200A in a top view. The antennas 200A and 200B may be used in place of the antenna 200 as illustrated above in FIG. 1. Antenna 200A may be used to couple to an inner region of the plasma generating region 112 (see above, FIG. 1), and antenna 200B may be used to couple to an outer region of the plasma generating region 112 surrounding the inner region. In some embodiments, antenna 200A and antenna 200B are coupled to a same RF source 101. The antenna 200A and antenna 200B may be coupled to the same RF source 101 through a same matching circuit 102. However, the antenna 200A and antenna 200B may also be coupled to the same RF source 101 through different matching circuits 102. In other embodiments, the antenna 200A and antenna 200B are each coupled to respective different RF sources 101 through respective matching circuits 102. Although FIG. 3 illustrates two antennas, any suitable number of separate antennas may be used in a plasma processing system, such as three to ten separate antennas. Each antenna may be coupled to a different respective RF source 101, or one or more antennas may share the same RF source.

A multitone (MT) signal is a signal comprised of two or more single frequencies (also referred to as tones) referenced to a fundamental frequency and spread across a specified frequency band. The fundamental frequency is, for example, a nominal frequency at which the RF source 101 can operate and around which the RF source 101 is capable of generating tones, thereby governing the mean frequency, median frequency, and central frequency of the multitone signal. Tones are particular frequencies that are not (necessarily) harmonics or the fundamental frequency. The fundamental frequency may or may not be one of the tones, and there may or may not be a tone located at the fundamental frequency. Multitone signals can be implemented on one or a plurality of sources (e.g., RF sources 101) in a continuous wave or pulsed plasma processing system. In other words, the multitone signals may be continuous wave signals or pulsed signals. The generated signal may have a width of 99%, 75%, 50%, 20%, 10%, or the like, of the fundamental frequency, where the highest tone is less than the $2^{nd}$ harmonic of the fundamental frequency. The generated signal may also have a width of 101%, 110%, 190%, 199%, or the like, of the fundamental frequency, where the highest tone is greater than the $2^{nd}$ harmonic of the fundamental frequency. This bandwidth can be assigned according to the needs of the plasma system, such as to compensate for frequency shifts of the plasma or to drive multiple antennas. The spacing of each individual frequency in the band is determined by the total width of the band, as well as the number of tones (single frequencies) that are generated within the band. The spacing between tones may be consistent or irregular. The multitone signal may have a discrete spectrum (individual tones separated by some widths in frequency space) or a continuous spectrum. Power, phase, and spacing of each tone may be distributed evenly to each tone or individually assigned to each tone based on the needs of the plasma processing system. The power, phase, and spacing of each tone may be adjusted in real time, such as to increase efficiency of a plasma process. For example, the multitone signal may be adjusted in real time by shifting the frequencies of one or more of the tones, increasing or decreasing the number of tones, or changing the separation of the tones in frequency space. The fundamental frequency of the multitone signal or one or more tones of the multitone signal may be shifted while performing the plasma process, such as in response to the resonant frequency of the plasma shifting during the performing of a plasma process.

The multitone signal may be set so that a resonant frequency of the plasma (depending on the antenna, the plasma itself and its changing conditions, and any other structures that may influence the resonance) resides between frequencies of tones of the multitone signal. In some embodiments, a frequency of one of the tones of the multitone signal is substantially equal to a resonant frequency of the plasma, such as during steady state plasma processing. A frequency of one of the tones of the multitone signal may be substantially equal to the resonant frequency of the plasma during the ignition of the plasma, which may be advantageous for efficient plasma ignition.

The bandwidth of the multitone signal can be set in multiple ways. For example, the bandwidth of the multitone signal may be set as a generic, fixed percentage (ex: 0.5%, 1%, 5%) of the fundamental frequency of the multitone signal. Other bandwidths can be determined based on experimental data. A wider bandwidth can be selected for more robust operation with decreased probability of loss of plasma ignition, or a narrow bandwidth can be selected for more efficient power usage.

The width and behavior of the multitone signal can be calculated using any suitable measurement (such as measurements of reflected power with a VI sensor or antenna voltage) that determine its effect on the plasma processing system. For example, a smaller width of the multitone signal may be set if the matching circuit is fast enough for the resonant frequency to not go out of bounds and trigger a loss of plasma before the matching circuit has time to react. A larger width of the multitone signal may be set if the matching circuit is slower than the speed needed to compensate for a change in resonance. Additionally, multitone signals for pulsed plasmas may have different desirable bandwidths than multitone signals for continuous wave plasmas.

The width of the multitone signal can also be determined by measuring a frequency range controlled by the capacitances of capacitors in the matching circuit (e.g., a first variable capacitor and a second variable capacitor with different ranges of capacitances). By measuring the extremes of frequencies that can be reached by changing the capacitances of the matching circuit, a multitone signal can be produced with a width that encompasses the entire frequency range producible by the matching circuit. This may be advantageous by reducing or preventing a shift in the resonant frequency of the signal from extinguishing a lit plasma.

Although FIGS. 1-3 illustrate examples of systems and antennas for inductively coupled plasma (ICP) that may be used with multitone signals, it should be understood that multitone signals may also be used to drive non-ICP systems (e.g., capacitively coupled plasma (CCP) systems or the like). For example, multitone signals may be used wherever there is a resonance of an RF system and the plasma, regardless of the method of coupling energy to the plasma.

Figure 4:
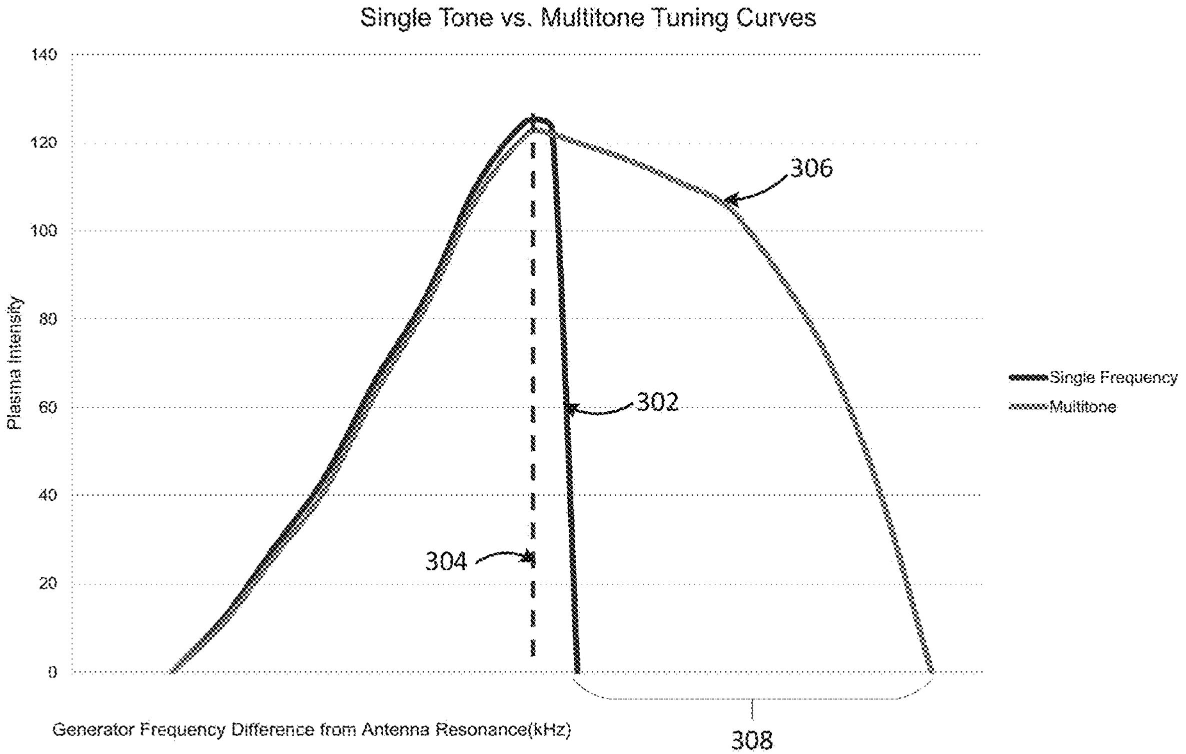
FIG. 4 illustrates a graph of single and multitone tuning curves, in accordance with some embodiments.

FIG. 4 is a graph of single tone and multitone tuning curves illustrating how multitone signals can compensate for frequency cliffs, in accordance with some embodiments. A multitone signal comprises two or more single frequency signals that are combined into one signal output. One significant issue with traditional RF generation for plasma processing (using a single frequency) is the difficulty of tuning the generated RF waveform to the antenna(s), even with a matching circuit. This is because the antenna(s) may be very sensitive to the frequency of the RF signal, which can produce an operating cliff where the plasma can quickly extinguish if the generated RF frequency and the resonant frequency of the antenna are offset. An operating cliff (also referred to as a frequency cliff) is illustrated in FIG. 4 by the single frequency plasma intensity 302 produced with continuous wave (CW) power. The single frequency plasma intensity 302 drops sharply as the RF frequency driving the antenna exceeds the resonant frequency 304 (depending on the antenna, the plasma itself and its changing conditions, and any other structures that may influence the resonance), demonstrating a frequency cliff. This occurs because all of the power of the signal is concentrated at one frequency.

The multitone plasma intensity 306, however, does not demonstrate frequency cliff behavior after the fundamental frequency crosses the resonant frequency 304 because not all of the tones are out of resonance. Multitone tuning can thus enable power to remain at the resonant frequency even if the resonant frequency shifts. This allows for more tuning options, as well as allowing the tuning to be more forgiving so that resonant frequency shifts do not cause the plasma to extinguish. As illustrated in FIG. 4, the multitone plasma intensity allows for an extended tuning frequency range 308 around the resonant frequency 304 that does not exhibit a sharp fall in plasma intensity. Instead, the multitone signal allows for a more gradual fall in plasma intensity, as the frequency moves off-resonance.

Figure 5:
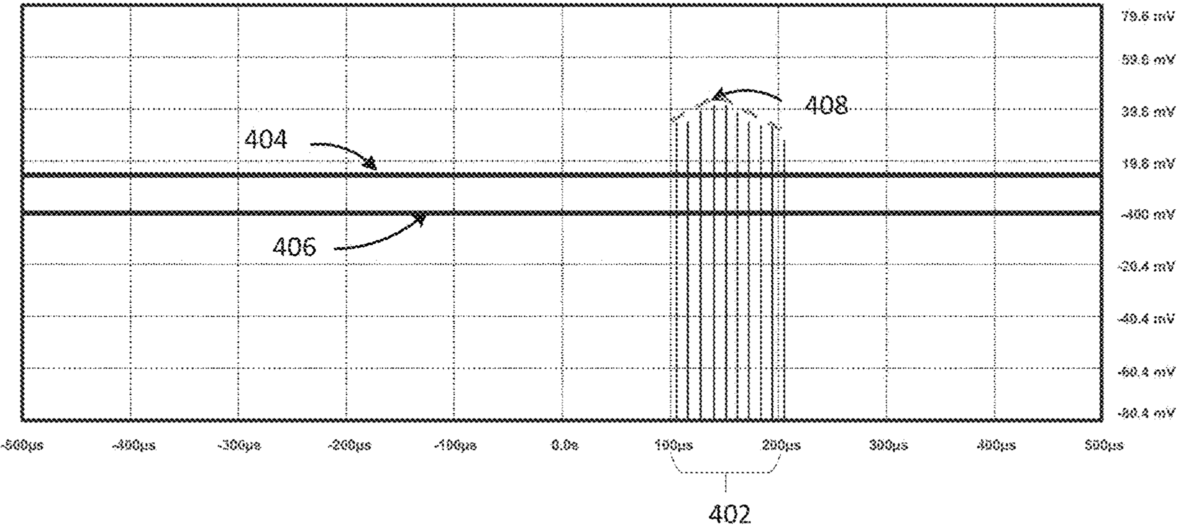
FIGS. 5 and 6 illustrate experimental results of multitone tuning, in accordance with some embodiments.
Figure 6:
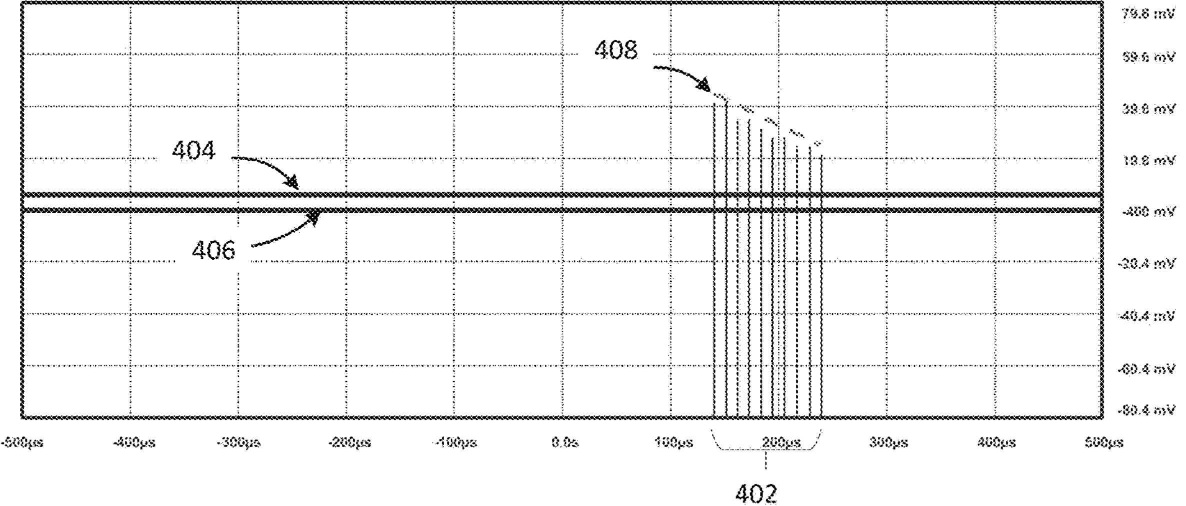

FIGS. 5 and 6 illustrate experimental results of multitone tuning, in accordance with some embodiments. FIG. 5 illustrates a graph of a multitone signal 402 during a plasma process (such as performed in a plasma processing system 100; see above, FIG. 1) with a plasma intensity 404 and a coil voltage 406. The multitone signal 402 comprises 10 tones, has a bandwidth of 1 MHz, and is centered on a resonant frequency 408 of an antenna (e.g., an antenna 200; see above, FIGS. 1-2) of the plasma processing system. The multitone signal 402 is extracted from the signal of the coil voltage 406.

Next, in FIG. 6, the frequency range of the multitone signal has shifted to a center frequency where a traditional single tone continuous wave signal would have not been able to sustain a plasma. In FIG. 6, the antenna resonant frequency is on the lower edge of the multitone signal 402 rather than near the center of the multitone signal 402 (see above, FIG. 5). However, even with this shift in frequency, the plasma remains lit as illustrated by the plasma intensity 404 decreasing relative to FIG. 5 but remaining significantly above zero. With multitone tuning, the resonance can also shift within the frequency bounds of a multitone signal yet still sustain plasma without the need to tune the multitone signal. A multitone signal can thus account for slower tuning algorithms and hardware as well as allowing the multitone bandwidth to be widened or narrowed according to the speed of various tuning systems. A multitone signal with a narrower bandwidth may deliver more power at a desired frequency (e.g., a resonant frequency of an antenna). A multitone signal with a wider bandwidth may allow for a wider tuning range or a slower tuner but may deliver less power at an individual frequency.

Shifts in a preferred frequency of the plasma (in other words, shifts in the resonant frequency of the generated plasma) may occur due to changes in the plasma process. As an example, changing from a first etch process to a second etch process may change the preferred frequency of the plasma. As another example, the preferred frequency of the plasma may be changed by an etch passing through a first layer comprising a first material (e.g., a nitride such as silicon nitride) and entering a second layer comprising a second material different from the first material (e.g., an oxide such as silicon oxide or silicon dioxide). As another example, changing the input power during a process step can alter the resonant frequency. Shifts in the preferred frequency can also occur unexpectedly. In some embodiments, shifts in the preferred frequency of the plasma occur over microsecond time scales, such as a range of 1 μs to 100 μs. Using a multitone signal with an appropriate bandwidth may allow the plasma to remain lit, despite the frequency shift, without needing as fast a tuner (e.g., a tuner operating as quickly as the frequency shift).

As illustrated by FIGS. 5 and 6, extracted, frequency-resolved multitone signals can be plotted in the frequency domain, which may allow for the resonance to be visualized while the plasma is lit instead of sweeping across frequencies intermittently to test for the desired frequency (in other words, the resonant frequency that depends on the antenna, the plasma itself and its changing conditions, and any other structures that may influence the resonance). The resonant frequency 408 appears as the highest peak of the frequency-resolved multitone signal 402 in both FIGS. 5 and 6. This illustrates one method of using a multitone signal to determine the resonant frequency, which may be subsequently used to further adjust the generated signal and improve efficiency.

Figure 7A:
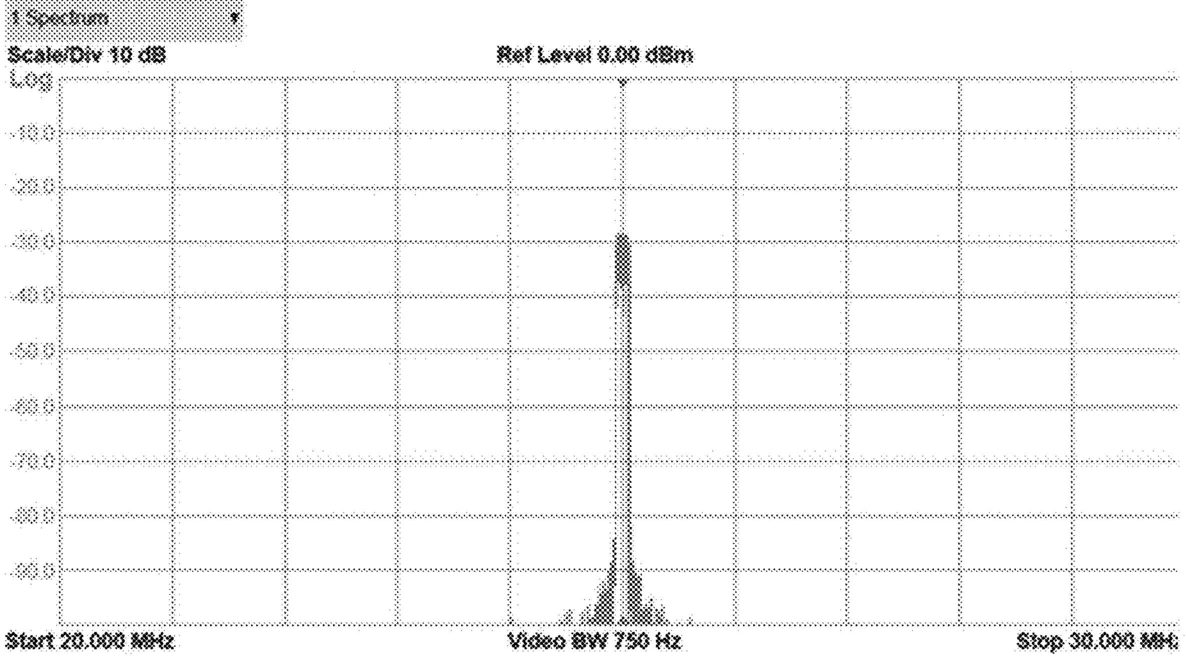
FIGS. 7A, 7B, and 8A-8C illustrate graphs of example multitone signals, in accordance with some embodiments.
Figure 7B:
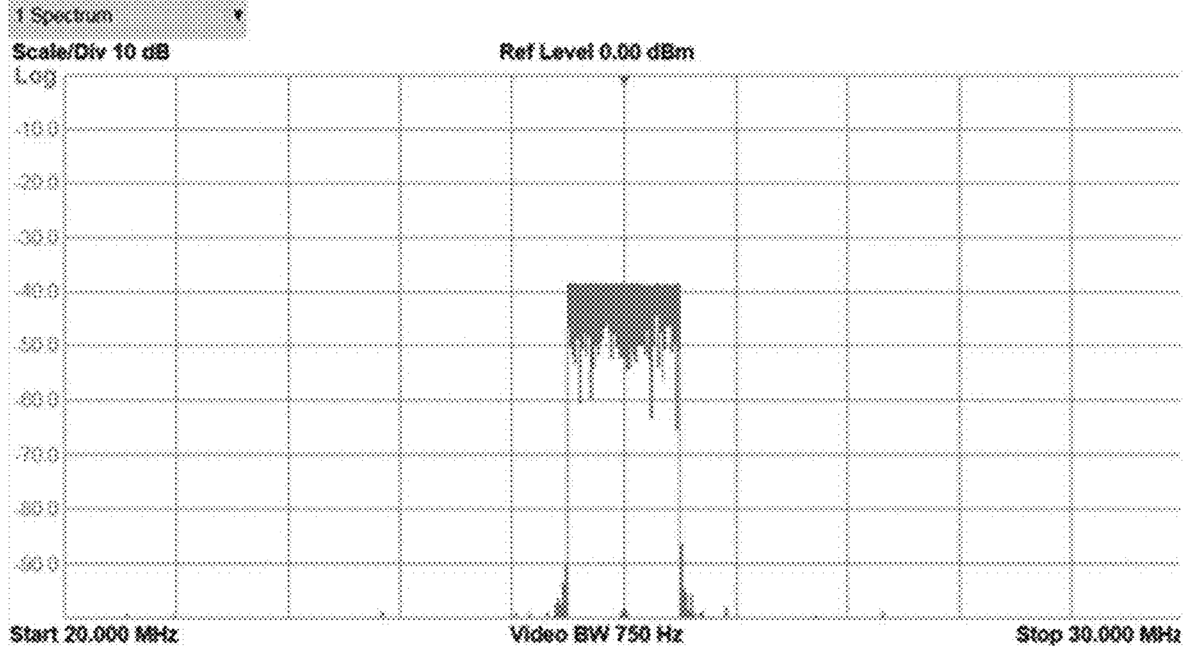

FIGS. 7A, 7B, and 8A-8C illustrate graphs of example multitone signals with different bandwidths and numbers of peaks, in accordance with some embodiments. The respective x-axes of FIGS. 7A, 7B, and 8A-8C show frequency and the respective y-axes of FIGS. 7A, 7B, and 8A-8C show power on a log scale. FIG. 7A illustrates a relatively narrow multitone signal with a bandwidth of 100 kHz, and FIG. 7B illustrates a relatively wide multitone signal with a bandwidth of 1 MHz. The multitone signal of FIG. 7A may provide power at a desired frequency with greater efficiency, while the multitone signal of FIG. 7B may be more robust, sustaining plasma despite resonant frequency shifts of the plasma.

Figure 8A:
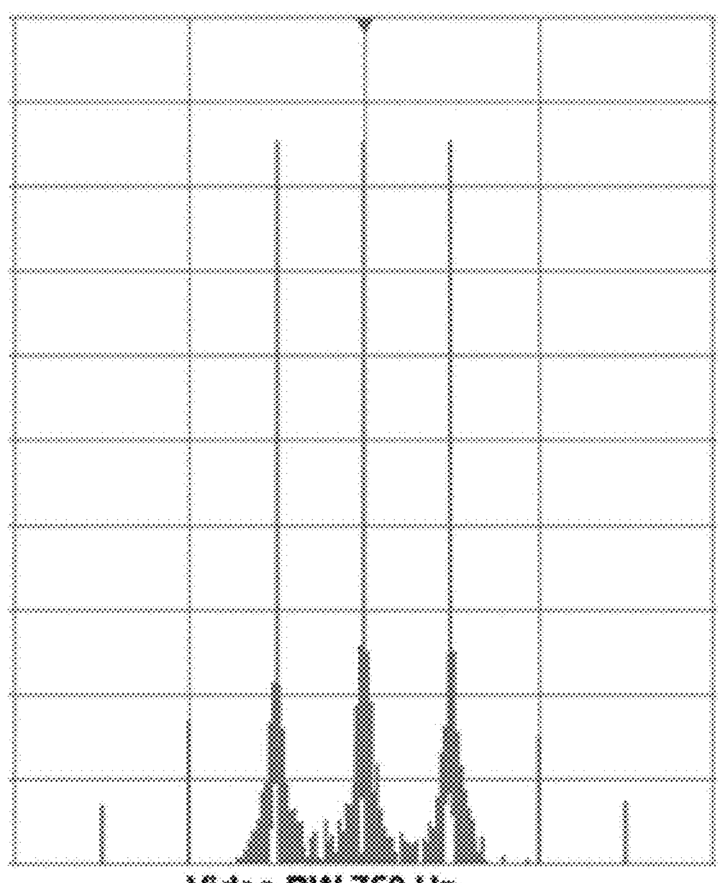
Figure 8B:
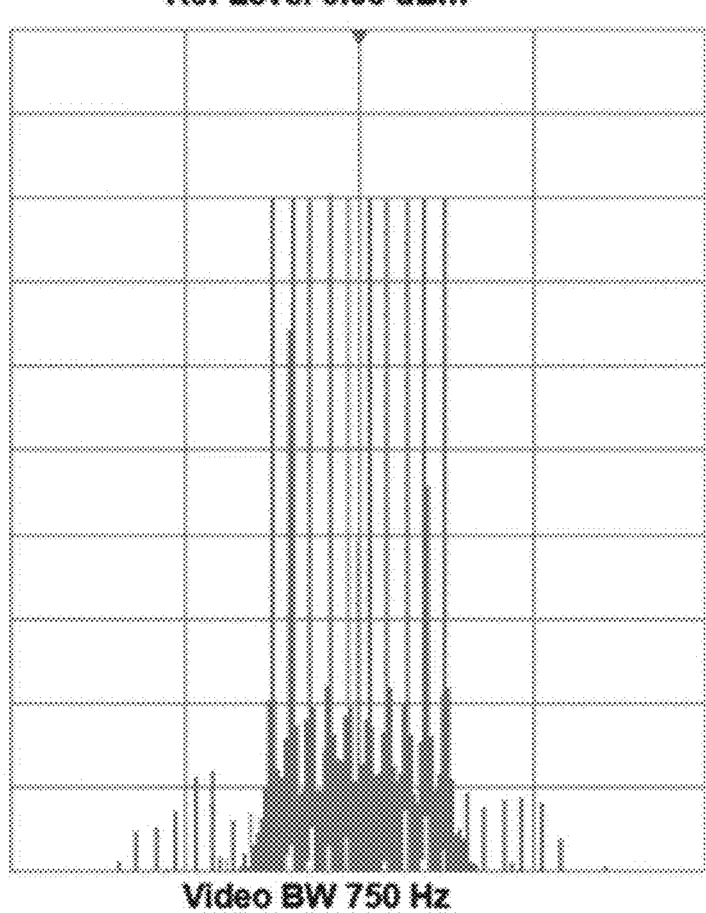
Figure 8C:
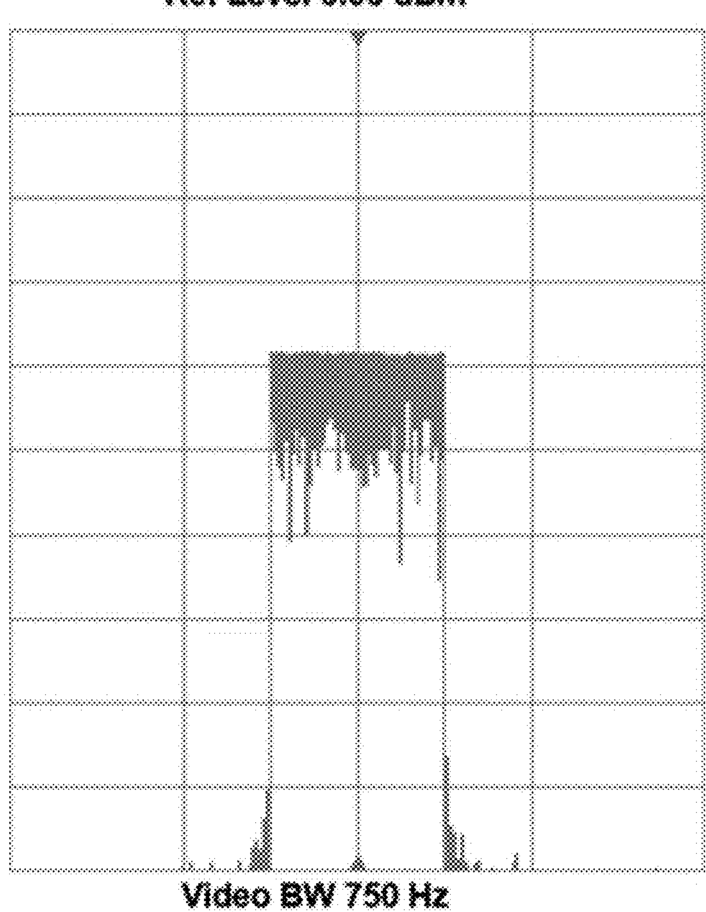

FIGS. 8A-8C illustrate graphs of example multitone signals with different numbers of tones within the same bandwidth, in accordance with some embodiments. The example multitone signals of FIGS. 8A-8C have a bandwidth of 1 MHz and the same total output power. The multitone signal of FIG. 8A is a three-tone multitone signal, the multitone signal of FIG. 8B is a ten-tone multitone signal, and the multitone signal of FIG. 8C is a one thousand- (1000-) tone multitone signal. As such, the different tones of the multitone signal of FIG. 8C are not distinguishable in the graph.

FIGS. 9A-9C, 10A-10D, 11A-11C, and 12A-12C illustrate various graphs and images relating to using multitone signals to control multiple antennas, in accordance with some embodiments. Multitone signals may be used for plasma generation by igniting plasma with multiple antennas at once (e.g., antennas 200A and 200B; see above, FIG. 3). For example, the antennas may have a large resonant frequency distance between them in order to control radial uniformity.

Figure 9A:
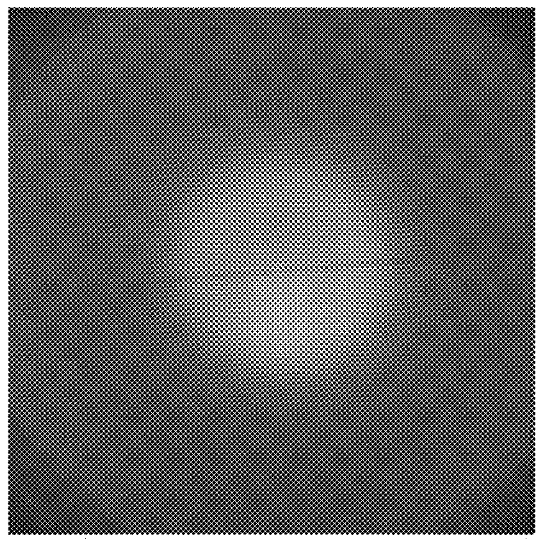
Figure 9A:
Figure 9B:
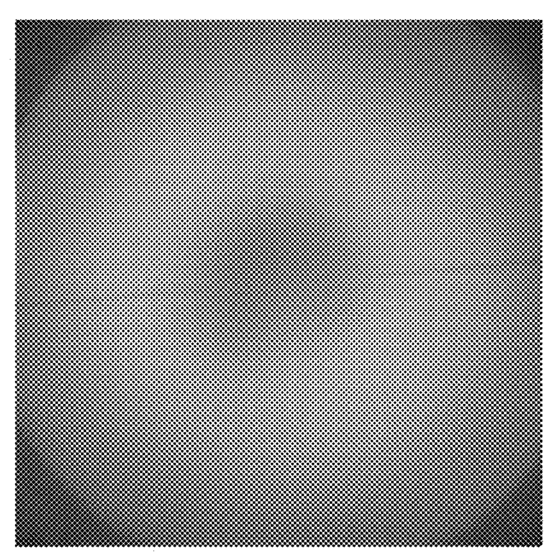
Figure 9C:
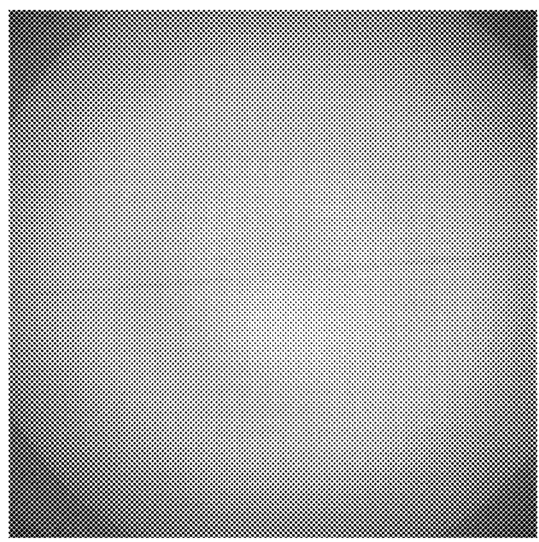

FIGS. 9A-9C illustrate pictures of plasma in a plasma chamber coupled to an inner antenna (also referred to as an inner coil) with a resonant frequency of 48 MHz and an outer antenna (also referred to as an outer coil) with a resonant frequency of 62 MHz. The pictures of the lit plasma were taken with a camera located at the bottom of the plasma chamber, opposite the antennas. As such, the outer antenna lights plasma at a first frequency (62 MHz) and the inner antenna lights at a different second frequency (48 MHz), separated from the first frequency by 14 MHz.

It may be difficult to ignite plasma with both inner and outer antennas at the same time using a traditional, single frequency continuous signal. For example, FIG. 9A illustrates a picture in which a single frequency of 48 MHz is supplied to the antennas, lighting plasma only in the center of the plasma chamber (also referred to as a central region) with the inner antenna, and FIG. 9B illustrates a picture in which a single frequency of 62 MHz is supplied to the antennas, lighting plasma only around the periphery of the plasma chamber with the outer antenna. Even if plasma is able to be ignited by both the inner and outer antenna simultaneously with a single frequency signal, neither antenna would be operating at their desired frequency and efficiency. However, by using a multitone signal, two separate tones at or close to each of the resonant frequencies can be generated at once to ignite both antennas at their respective resonant frequencies. In other words, each antenna may be driven by a respective tone of the multitone signal that is close to the respective resonant frequency of the antenna. For example, FIG. 9C illustrates a picture in which a multitone signal comprising tones at both 48 MHz and 62 MHz lights plasma with both the inner antenna and the outer antenna in the center and the periphery of the plasma chamber. This may be useful for uniformity control and achieving higher plasma densities with a same input power to each antenna.

Multitone signals may also be used to ignite plasma with multiple antennas in order to compensate for manufacturing tolerances between antennas. Although multiple antennas for a single plasma processing system or for multiple plasma processing systems may be manufactured with the intention of being resonant at the same frequency, there may be slight variations in resonant frequencies across the various antennas due to manufacturing tolerances. A multitone signal can be created to include the actual resonant frequency of every antenna. This may allow for the various manufacturing tolerances without expending additional time in order to tune each individual antenna to match with a specific single tone frequency. Multitone signals may also be used to compensate for other resonances, such as empty chamber resonance, during plasma ignition.

FIGS. 10A-10C illustrate pictures of lit plasma in a plasma chamber coupled with an inner antenna and an outer antenna having a 10 MHz difference between their respective resonant frequencies. The pictures of the lit plasma were taken with a camera located at the bottom of the plasma chamber, opposite the antennas. FIG. 10A illustrates a picture of plasma lit only in the center of the plasma chamber with the inner antenna by a single tone signal supplied at the resonant frequency of the inner antenna. FIG. 10B illustrates a picture of plasma lit only in the periphery of the plasma chamber with the outer antenna by a single tone signal supplied at the resonant frequency of the outer antenna. FIG. 10C illustrates a picture of plasma lit by a multitone signal comprising tones at the resonant frequencies of both the inner antenna and the outer antenna (in this example, tones separated by 10 MHz) in both the center and the periphery of the plasma chamber.

Figure 10D:
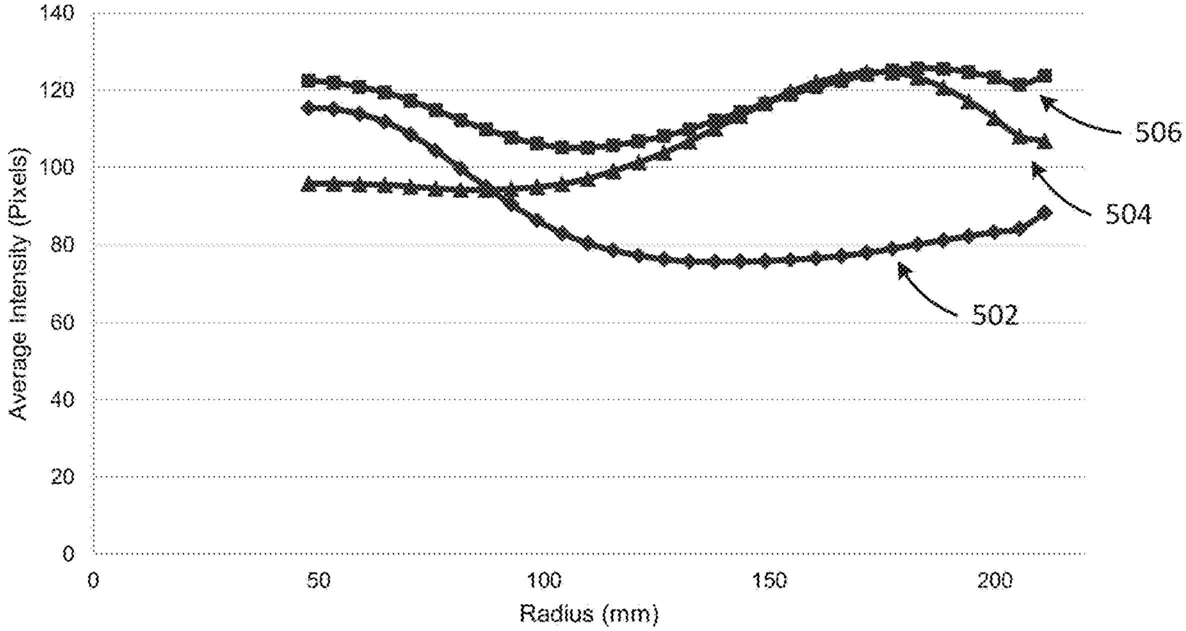

FIG. 10D illustrates a graph of the average plasma intensities versus radial distance from the center of the plasma chamber for the lit plasmas of FIGS. 10A-10C. The data for FIG. 10D was gathered from pixel intensity measurements from the camera located at the bottom of the plasma chamber. Trace 502 shows the radial plasma intensity of the lit plasma of FIG. 10A, trace 504 shows the radial plasma intensity of the lit plasma of FIG. 10B, and trace 506 shows the radial plasma intensity of the lit plasma of FIG. 10C. Using a multitone signal to light plasma with both the center and edge antennas allows for radial uniformity control, as illustrated by the radial uniformity of trace 506 relative to traces 502 and 504.

FIGS. 11A-11C and 12A-12C illustrate methods of using multitone signals to tune multiple antennas, in accordance with some embodiments. Continuous wave waveforms can be used to find desired resonances of multiple antennas in order to build multitone signals for igniting and maintaining plasmas with the multiple antennas simultaneously. Although FIGS. 11A-11C and 12A-12C use two antennas as an example, any suitable number of antennas may be tuned, such as three to ten antennas. A power distribution method may be chosen for distributing power between tones of the multitone signal. A first power distribution method involving tuning the powers of individual tones is described below with respect to FIGS. 11A-11C. A second power distribution method involving shifting frequencies of the multitone signal to approach antenna resonances is described below with respect to FIGS. 12A-12C. After the desired power distribution method and frequency bandwidths of a multitone signal waveform are determined, the multitone signal waveform may be built and sent to a generator (e.g., an RF source 101) for use in a plasma processing system.

Figures 11A, 11B, 11C:
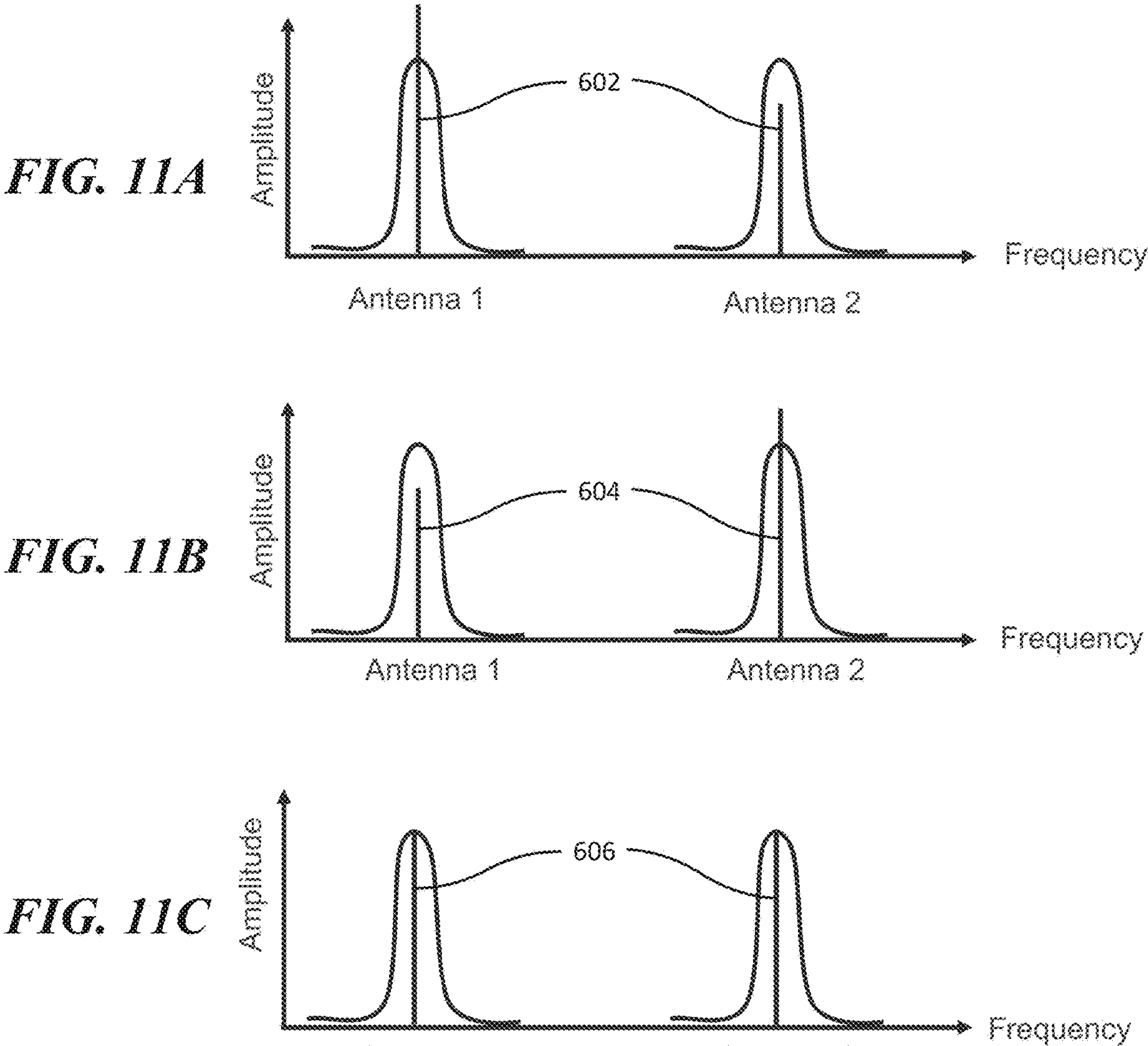

FIGS. 11A-11C illustrate graphs of respective resonance curves of an antenna 1 and an antenna 2 with overlaid multitone signals 602, 604, and 606, in accordance with some embodiments. Each figure illustrates amplitude versus frequency for the antenna resonance curves and the multitone signals. The amplitudes of the antenna resonance curves indicate the power couplings of the respective Antennas 1 and 2. The multitone signals 602, 604, and 606 are two-tone signals, of which each tone is tuned to match the respective resonant frequency of either Antennas 1 or 2. After matching the resonant frequency, the individual tone powers are tuned according to the balance needed between the power outputs of the individual antennas. FIG. 11A illustrates a multitone signal 602 with a power distribution that favors Antenna 1 over Antenna 2. FIG. 11B illustrates a multitone signal 604 with a power distribution that favors Antenna 2 over Antenna 1. FIG. 11C illustrates a multitone signal 606 with a balanced power distribution between Antennas 1 and 2 (in other words, with a power ratio between a first tone driving a resonance of Antenna 1 and a second tone driving a resonance of Antenna 2 tuned to balance the power distribution). In some embodiments, tuning a power ratio between the power of the first tone and the power of the second tone alters a radial plasma profile generated by the antenna system comprising Antennas 1 and 2. Achieving a balanced power distribution may be useful for reducing reflected power from the antennas and increasing efficiencies. Although the power distribution method illustrated by FIGS. 11A-11C uses two antennas as an example, it may be generalized to any suitable number of antennas (e.g., three to ten antennas), and any and all such power distribution methods are within the scope of the disclosed embodiments.

Figures 12A, 12B, 12C:
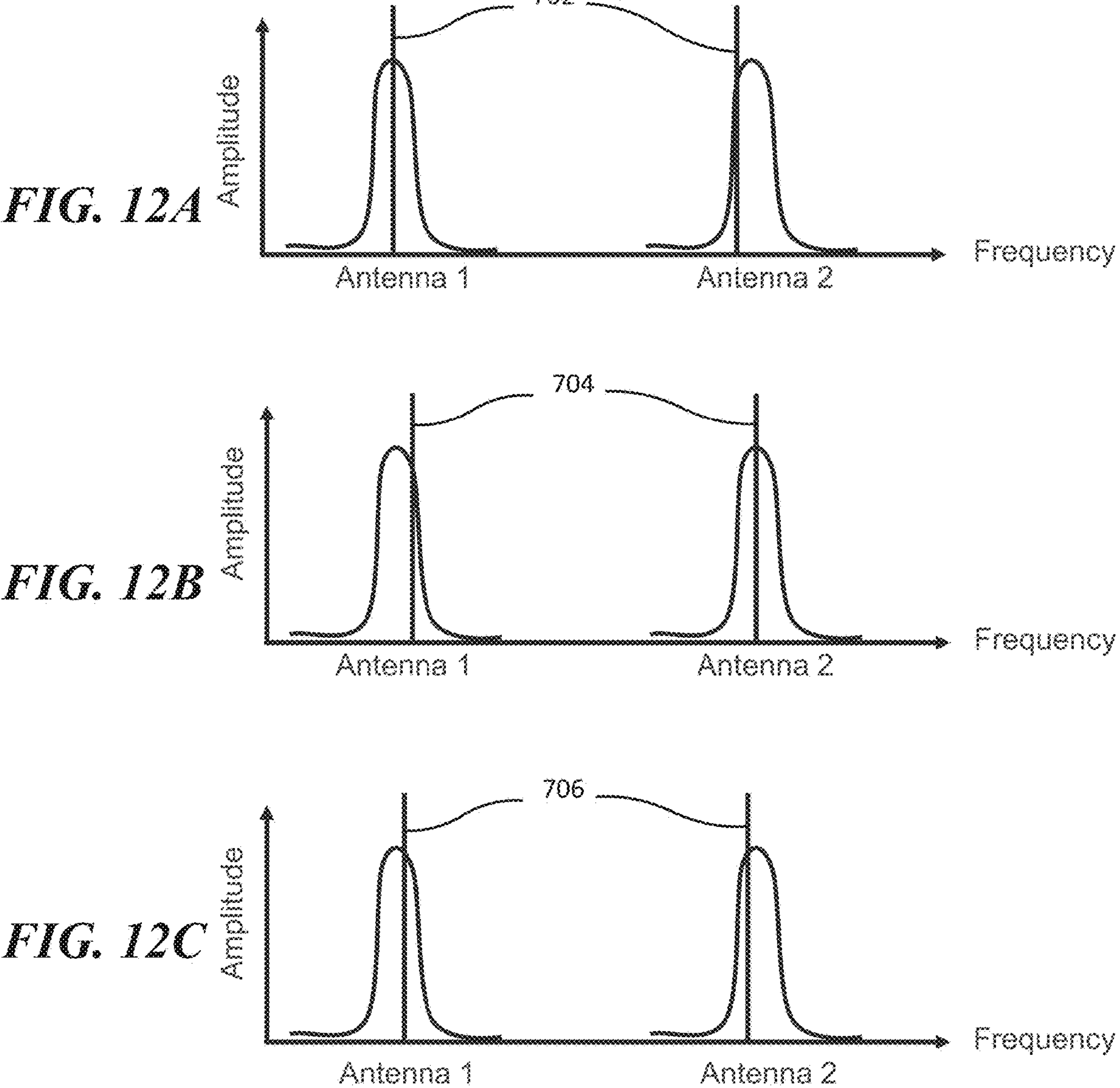

FIGS. 12A-12C illustrate respective resonance curves of an Antenna 1 and an Antenna 2 with overlaid multitone signals 702, 704, and 706, in accordance with some embodiments. The multitone signals 702, 704, and 706 are two-tone signals where the spacing of the tones is different than the resonant frequency difference between the two antennas (for example, the tone spacing is 9.5 MHz and the antenna resonance difference is 10 MHz). In the power distribution method illustrated by FIGS. 12A-12C, the multitone signal remains the same (respective powers of each tone and the distance between each tone in frequency space are kept constant), while the fundamental frequency (which governs the mean frequency, median frequency, and central frequency) of the tones is shifted, effectively shifting the frequencies of the multitone signal. This may be more time efficient than the power distribution method described above with respect to FIGS. 11A-11C. FIG. 12A illustrates a multitone signal 702 with a fundamental frequency that generates a multitone signal which favors Antenna 1 over Antenna 2 (on-resonance for Antenna 1 and slightly off-resonance for Antenna 2). FIG. 12B illustrates a multitone signal 704 with a fundamental frequency that favors Antenna 2 over Antenna 1. FIG. 12C illustrates a multitone signal 706 with a fundamental frequency whose tones balance the output between the resonances of Antennas 1 and 2 (in other words, with a first tone driving a resonance of Antenna 1 and a second tone driving a resonance of Antenna 2, both tones off-resonance by the same amount). Although the power distribution method illustrated by FIGS. 12A-12C uses two antennas as an example, it may be generalized to any suitable number of antennas (e.g., three to ten antennas), and any and all such power distribution methods are within the scope of the disclosed embodiments. In some embodiments, the resonance of Antenna 1 is driven by two or more respective tones and/or the resonance of Antenna 2 is driven by two or more respective tones.

In addition to reducing or eliminating plasma extinguishment due to frequency cliffs, tracking shifting antenna resonances, and achieving radial profile control of plasmas, multitone signals may be used to achieve pulse profile control for pulsed plasma processes. Traditional single frequency tuning allows for achieving reduced reflected power, but multitone tuning further allows for tuning of pulse frequencies to achieve faster rise time and/or higher plasma density while simultaneously reducing average reflected power.

Figure 13:
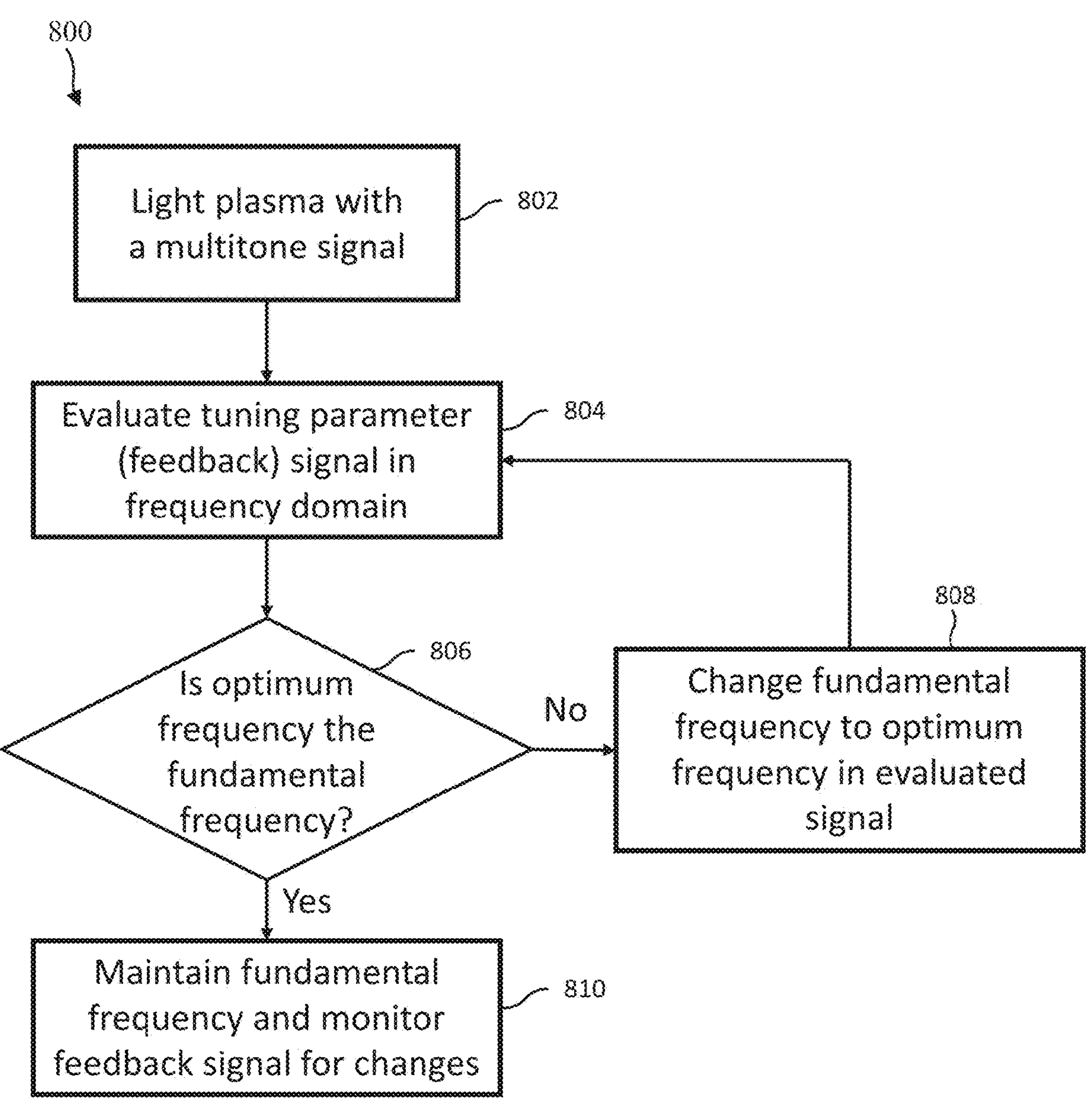
FIG. 13 illustrates a process flow chart diagram of a method for multitone tuning, in accordance with some embodiments.

FIG. 13 illustrates a process flow chart diagram of a method 800 for multitone tuning when a feedback signal can be frequency resolved, in accordance with some embodiments. The method 800 may be useful for tuning a multitone signal to be close to a desired frequency or for monitoring and adjusting a multitone signal when either plasma conditions or desired resonant frequencies are changing (e.g., due to changes in etching processes such as etching from one layer to a different layer). In step 802, a plasma is lit with a multitone signal. Next, in step 804, a tuning parameter extracted from a feedback signal is evaluated in a frequency domain. In some embodiments, the tuning parameter is the coil voltage or reflected power. The tuning parameter may be extracted from data processed by a programmable computer, microprocessor, or the like associated with the plasma processing system.

In step 806, which follows from step 804, the tuning parameter is evaluated (e.g., by the computer) to determine whether the measured multitone signal is desirably tuned. For example, in embodiments where the tuning parameter is reflected power, the minimum reflected power may be desired on the center tone. If the check of the tuning parameter confirms that the generator multitone signal is not desirably tuned, the method 800 proceeds to step 808. If the check of the tuning parameter confirms that the generator multitone signal is desirably tuned, the method 800 proceeds to step 810.

In step 808, the control parameter (e.g., the fundamental frequency) of the multitone signal is changed based on the evaluated feedback signal. For example, the new fundamental frequency may be set so the frequency with minimum reflected power in the previously evaluated signal is the fundamental frequency of the new signal. The method 800 then returns to step 804 to evaluate the tuning parameter (e.g., reflected power) in the frequency domain again.

In step 810, the desired frequency has been achieved for the multitone signal (e.g., the fundamental frequency is desirably close to a resonant frequency of an antenna). The control parameter (e.g., the fundamental frequency) is maintained while the plasma remains lit and the feedback signal is monitored for subsequent changes. If a significant change occurs (such as a sudden increase in reflected power), the method 800 can return to step 804.

Figure 14:
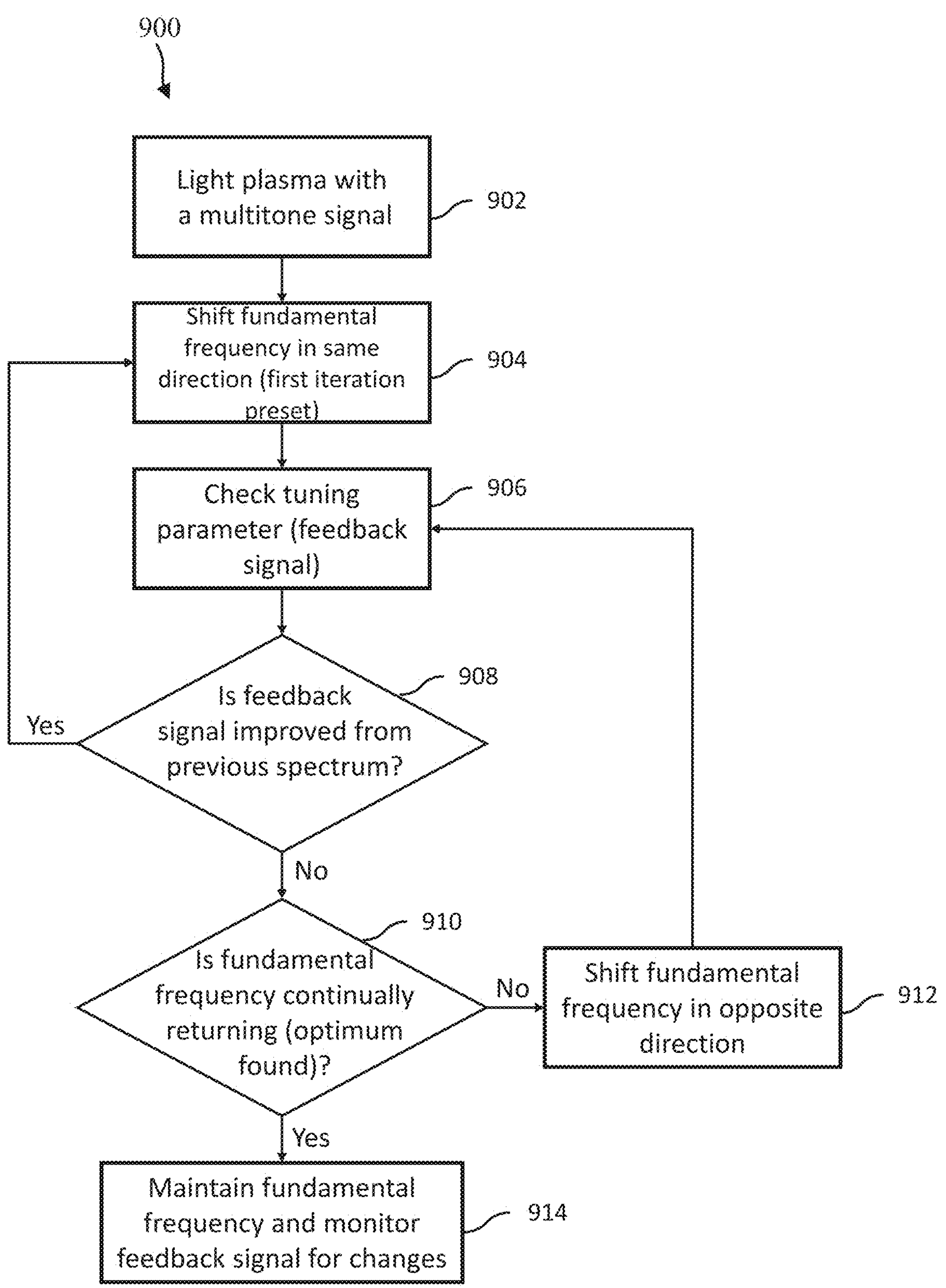
FIG. 14 illustrates a process flow chart diagram of another method for multitone tuning, in accordance with some embodiments.

FIG. 14 illustrates a process flow chart diagram of a method 900 for multitone tuning when a feedback signal cannot be frequency resolved, in accordance with some embodiments. The method 900 may be useful for similar situations as the method 800 described above with respect to FIG. 13. In step 902, a plasma is lit with a multitone signal. Next, in step 904, a fundamental frequency of the multitone signal is shifted in a same direction as a previous shift. If this is the first time that step 904 has been performed, the fundamental frequency may not be shifted.

In step 906, following from step 904, a tuning parameter is extracted from a feedback signal to be checked for. In some embodiments, the control parameter is a fundamental frequency of the multitone signal and the tuning parameter is extracted from a signal of a coil voltage or reflected power (for example, measured from a sensor on a power transmission line). The tuning parameter may be extracted from data processed by a programmable computer, microprocessor, or the like associated with the plasma processing system.

Next, in step 908, the feedback signal is evaluated (e.g., by the computer) to check if it is improved from a previous spectrum of the multitone signal (for example, has average reflected power decreased). If the feedback signal has been desirably changed, the method 900 returns to step 904. If the feedback signal has not been desirably changed, the method 900 proceeds to step 910.

In step 910, the feedback signal is checked to determine whether the fundamental frequency is continually cycling between three control values. The feedback loop will continually overshoot the optimum value in one direction to reach one control value and then reverse to overshoot the optimum value in the opposite direction to reach the other control value (in other words, it overcorrects). The controller may be configured to detect this behavior and identify that the optimum value for the fundamental frequency is the center of these three control values. Once the optimum value for the fundamental frequency is found, the method 900 proceeds to step 914. If the fundamental frequency is not continually returning to the desired frequency, the method 900 proceeds to step 912.

In step 912, the fundamental frequency of the multitone signal is shifted in the opposite direction as the previous shift. The method 900 then returns to step 906.

In step 914, the desired frequency has been achieved for the multitone signal (e.g., the fundamental frequency is desirably close to a resonant frequency of an antenna). The control parameter (e.g., the fundamental frequency) is maintained while the plasma remains lit and the feedback signal is monitored for subsequent changes. If a significant change occurs (such as an increase in reflected power), the method 900 can return to step 904.

Figure 15:
FIG. 15 illustrates a process flow chart diagram of a method for multitone plasma processing, in accordance with some embodiments.
Figure 15:
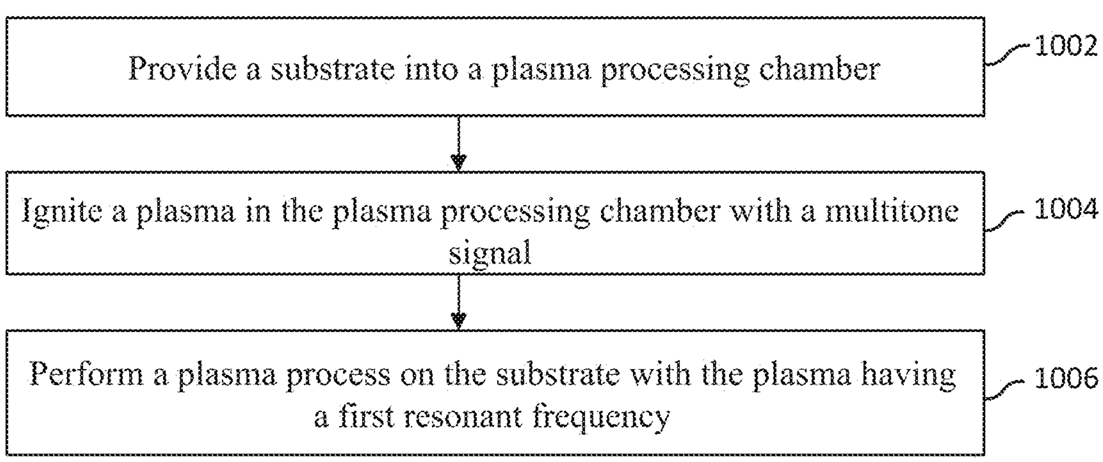

FIG. 15 illustrates a process flow chart diagram of a method 1000 for multitone plasma processing, in accordance with some embodiments. In step 1002, a substrate 110 is provided into a plasma processing chamber 106, as described above with respect to FIG. 1. In step 1004, a plasma is ignited in the plasma processing chamber 106 with a multitone signal, as described above with respect to FIGS. 1 and 4. In step 1006, a plasma process is performed on the substrate 110 with the plasma, as described above with respect to FIG. 1. The plasma has a first resonant frequency during the plasma process. A width in frequency between the first tone and the fundamental frequency is less than 1% to 99% of the fundamental frequency.

Figure 16:
FIG. 16 illustrates a process flow chart diagram of a method for multitone plasma processing, in accordance with some embodiments.
Figure 16:
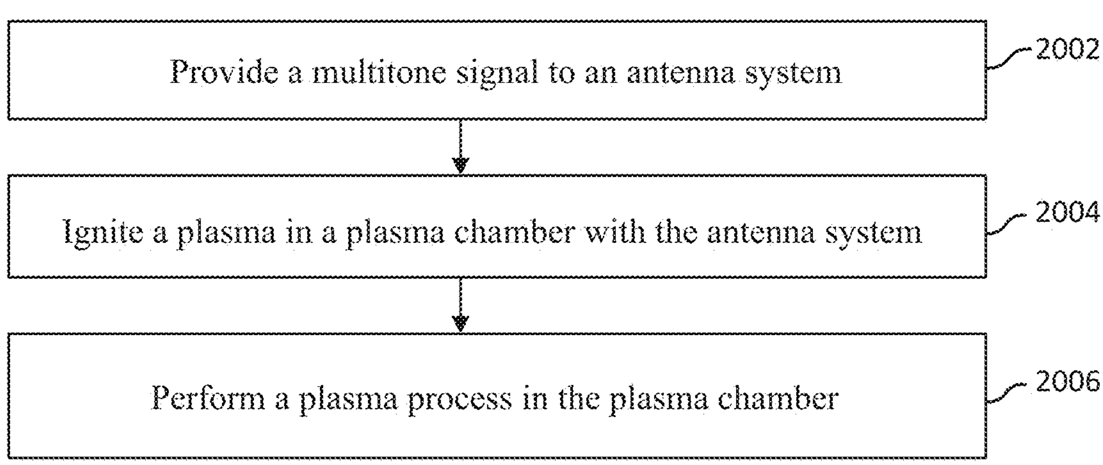

FIG. 16 illustrates a process flow chart diagram of a method 2000 for multitone plasma processing, in accordance with some embodiments. In step 2002, a multitone signal is provided to an antenna system (e.g., antennas 200A and 200B) with a first resonance and a second resonance, as described above with respect to FIGS. 3 and 9A-9C. The multitone signal comprises a first tone driving the first resonance and a second tone driving the second resonance. In step 2004, a plasma is ignited in a plasma chamber (e.g., the plasma processing chamber 106) with the antenna system, as described above with respect to FIGS. 9A-9C. In step 2006, a plasma process is performed in the plasma chamber, as described above with respect to FIG. 1.

In various embodiments, the fundamental frequency is a resonant frequency of the plasma. In various embodiments, the tones of the multitone signal are evenly distributed. In various embodiments, spacings between tones of the multitone signal are irregular. In various embodiments, power is evenly distributed across all tones of the multitone signal. In various embodiments, power is nonuniform across the tones of the multitone signal.

Tones of the multitone signal may have assigned phases. In some embodiments, assigned phases of each tone of the multitone signal relative to the phase of the fundamental frequency are identical. In other embodiments, assigned phases of each tone of the multitone signal relative to the phase of the fundamental frequency are not all identical.

In some embodiments, a tone of the multitone signal has a frequency that is substantially equal to the fundamental frequency of the multitone signal. In other embodiments, no tones of the multitone signal have a frequency that is substantially equal to the fundamental frequency of the multitone signal.

In various embodiments, one or more properties of the multitone signal (e.g., power distribution, phase distribution, bandwidth, tone spacing, number of tones, or any combination thereof) are changed during the plasma process.

In some embodiments, the plasma is ignited with a single frequency and sustained with a multitone signal. In other embodiments, the plasma is ignited with a multitone signal and sustained with a single frequency.

In various embodiments, a shift in plasma resonant frequency occurs during the plasma process. The original plasma resonant frequency and the new resonant frequency may both be within the bandwidth of the multitone signal (in other words, between a first tone and a last tone of the multitone signal).

In some embodiments, a second plasma process is performed on a substrate with the plasma after performing a first plasma process with a multitone signal including a first tone and a second tone. The plasma has a first resonant frequency during the first plasma process and a second resonant frequency during the second plasma process. The second resonant frequency is between the first tone and the second tone. In some embodiments, the plasma process includes etching through a first layer over the substrate and etching a second layer over the substrate, where the second layer is under the first layer. The resonant frequency of the plasma may be the first resonant frequency while etching through a first layer, and the resonant frequency of the plasma may shift to a second resonant frequency while etching the second layer. In some embodiments, the first resonant frequency and the second resonant frequency are between the first tone and the second tone. In some embodiments, the tones of the multitone signal have an even power distribution. A spacing in frequency between each tone of the multitone signal may be different from a spacing in frequency between resonances of the plasma.

Example embodiments of the disclosure are summarized here. Other embodiments can also be understood from the entirety of the specification as well as the claims filed herein.

Example 1. A method for multitone plasma processing, the method including: providing a substrate into a plasma processing chamber; igniting a plasma in the plasma processing chamber with a multitone signal, the multitone signal including a first tone and a second tone, at least the first tone having a frequency that is not a fundamental frequency of the multitone signal nor a frequency of a harmonic of the fundamental frequency; and performing a plasma process on the substrate with the plasma, the plasma having a first resonant frequency, where a width in frequency between the first tone and the fundamental frequency is less than 1% to 99% of the fundamental frequency.

Example 2. The method of example 1, where the multitone signal includes up to ten tones.

Example 3. The method of example 1, where the multitone signal includes up to one thousand tones.

Example 4. The method of one of examples 1 to 3, where the first resonant frequency resides between respective frequencies of the first and second tones.

Example 5. The method of one of examples 1 to 3, where the frequency of one of the first and second tones is substantially equal to the first resonant frequency.

Example 6. The method of one of examples 1 to 5, where the frequency of one of the first and second tones is substantially equal to the resonant frequency of the plasma during igniting the plasma.

Example 7. The method of one of examples 1 to 6, further including shifting the resonant frequency of the plasma to a second resonant frequency during performing the plasma process.

Example 8. The method of one of examples 1 to 7, further including a shifting of the fundamental frequency of the multitone signal.

Example 9. The method of one of examples 1 to 8, further including shifting the frequency of at least one tone of the multitone signal with respect to the fundamental frequency.

Example 10. The method of one of examples 1 to 9, where the first tone is a resonant frequency of a first antenna and the second tone is a resonant frequency of a second antenna.

Example 11. The method of one of examples 1 to 10, where the multitone signal is a pulsed signal.

Example 12. The method of one of examples 1 to 10, where the multitone signal is a continuous wave signal.

Example 13. The method of one of examples 1 to 12, where the fundamental frequency is a resonant frequency of the plasma.

Example 14. The method of one of examples 1 to 13, where the tones of the multitone signal are evenly distributed.

Example 15. The method of one of examples 1 to 13, where spacings between tones of the multitone signal are irregular.

Example 16. The method of one of examples 1 to 15, where power is evenly distributed across all tones of the multitone signal.

Example 17. The method of one of examples 1 to 15, where power is nonuniform across the tones of the multitone signal.

Example 18. The method of one of examples 1 to 17, where respective assigned phases of each tone of the multitone signal relative to the phase of the fundamental frequency is identical.

Example 19. The method of one of examples 1 to 17, where respective assigned phases of each tone of the multitone signal relative to the phase of the fundamental frequency are not all identical.

Example 20. The method of one of examples 1 to 19, where a tone of the multitone signal has a frequency that is substantially equal to the fundamental frequency.

Example 21. The method of one of examples 1 to 19, where no tones of the multitone signal have a frequency that is substantially equal to the fundamental frequency.

Example 22. The method of one of examples 1 to 21, where one or more properties of the multitone signal are changed during the plasma process.

Example 23. The method of one of examples 1 to 22, further including performing another plasma process on the substrate with the plasma after performing the plasma process, where the plasma has a second resonant frequency during the another plasma process, the second resonant frequency being between the first tone and the second tone.

Example 24. The method of one of examples 1 to 23, where the plasma process includes: etching through a first layer over the substrate; and etching a second layer over the substrate, the second layer being under the first layer.

Example 25. The method of example 24, where the resonant frequency of the plasma is the first resonant frequency while etching through a first layer, and where the resonant frequency of the plasma shifts to a second resonant frequency while etching the second layer.

Example 26. The method of example 25, where the first resonant frequency and the second resonant frequency are between the first tone and the second tone.

Example 27. The method of one of examples 1 to 26, where the first tone is a resonant frequency of a first antenna and the second tone is a resonant frequency of a second antenna, the first antenna and the second antenna being used to ignite the plasma.

Example 28. A method for multitone plasma processing, the method including: providing a multitone signal to an antenna system including a first resonance and a second resonance, where the multitone signal includes a first tone driving the first resonance and a second tone driving the second resonance; igniting a plasma in a plasma chamber with the antenna system; and performing a plasma process in the plasma chamber.

Example 29. The method of example 28, where the first resonance ignites a first plasma in a center region of the plasma chamber and the second resonance ignites a second plasma in a periphery of the plasma chamber, the periphery surrounding the center region.

Example 30. The method of one of examples 28 or 29, where the multitone signal includes groups of tones, each group of tones clustered around a respective resonance of the antenna system.

Example 31. The method of one of examples 28 to 30, where the antenna system is a single antenna having the first resonance and the second resonance.

Example 32. The method of one of examples 28 to 30, where the antenna system includes a first antenna and a second antenna.

Example 33. The method of example 32, where the second antenna surrounds the first antenna in a top view.

Example 34. The method of one of examples 28 to 33, where the first antenna and the second antenna are coupled to a same RF source, the same RF source providing the multitone signal.

Example 35. The method of one of examples 28 to 34, further including a fundamental frequency of the multitone signal balancing an output between the first resonance and the second resonance.

Example 36. The method of one of examples 28 to 35, where the multitone signal further includes a third tone further driving the first resonance and a fourth tone further driving the second resonance.

Example 37. The method of one of examples 28 to 36, further including tuning a power ratio between the first tone and the second tone.

Example 38. The method of one of examples 28 to 36, where the first tone and the second tone have a same power.

Example 39. The method of one of examples 28 to 36, further including tuning a first power of the first tone and a second power of the second tone, where tuning the power ratio between the first power and the second power alters a radial plasma profile generated by the antenna system.

Example 40. The method of one of examples 28 to 36, where the tones of the multitone signal have an even power distribution, and where a spacing in frequency between each tone of the multitone signal is different from a spacing in frequency between resonances of the plasma.

Example 41. A method for multitone tuning, the method including: lighting a plasma in a plasma processing system with a multitone signal; controlling a fundamental frequency of the multitone signal; monitoring a full bandwidth of a feedback signal of the plasma processing system; shifting the fundamental frequency in response to analysis of the feedback signal; and after determining that the fundamental frequency is at a desired frequency, maintaining the fundamental frequency of the multitone signal while set conditions of the plasma are unchanged and monitoring the feedback signal for changes.

Example 42. The method of example 41, where the feedback signal is frequency resolved.

Example 43. The method of one of examples 41 or 42, where different tones of the multitone signal have a same power.

Example 44. The method of one of examples 41 to 43, where the feedback signal is a coil voltage.

Example 45. The method of one of examples 41 to 43, where the feedback signal is extracted from a reflected power.

Example 46. The method of example 45, where the feedback signal is measured from a sensor on the power transmission line.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

providing a substrate into a plasma processing chamber;

igniting a plasma in the plasma processing chamber with a multitone signal, the multitone signal comprising a first tone and a second tone, at least the first tone having a frequency that is not a fundamental frequency of the multitone signal nor a frequency of a harmonic of the fundamental frequency; and performing a plasma process on the substrate with the plasma, the plasma having a first resonant frequency during a first plasma process, wherein a width in frequency between the first tone and the fundamental frequency is less than 1% to 99% of the fundamental frequency.

2. The method of claim 1, wherein the multitone signal comprises up to ten tones.

3. The method of claim 1, wherein the multitone signal comprises up to one thousand tones.

4. The method of claim 1, wherein the first resonant frequency resides between respective frequencies of the first and second tones.

5. The method of claim 1, wherein the frequency of one of the first and second tones is substantially equal to the first resonant frequency.

6. The method of claim 1, wherein the frequency of one of the first and second tones is substantially equal to the resonant frequency of the plasma during igniting the plasma.

7. The method of claim 1, further comprising a shifting of the resonant frequency of the plasma to a second resonant frequency during performing the plasma process.

8. The method of claim 1, further comprising shifting the fundamental frequency of the multitone signal.

9. The method of claim 1, further comprising shifting the frequency of at least one tone of the multitone signal with respect to the fundamental frequency.

10. The method of claim 1, wherein the first tone is a resonant frequency of a first antenna and the second tone is a resonant frequency of a second antenna.

11. The method of claim 1, wherein the multitone signal is a pulsed signal.

12. A method for plasma processing, the method comprising:

providing a multitone signal to an antenna system comprising a first resonance and a second resonance, the multitone signal comprising a first tone driving the first resonance, a second tone driving the second resonance, and a fundamental frequency of the multitone signal balancing an output between the first resonance and the second resonance;

igniting a plasma in a plasma chamber with the antenna system; and performing a plasma process in the plasma chamber.

13. The method of claim 12, wherein the antenna system is a single antenna having the first resonance and the second resonance.

14. The method of claim 12, wherein the antenna system comprises a first antenna and a second antenna.

15. The method of claim 14, wherein the first antenna and the second antenna are coupled to a same RF source, the same RF source providing the multitone signal.

16. The method of claim 12, wherein the multitone signal further comprises a third tone further driving the first resonance and a fourth tone further driving the second resonance.

17. The method of claim 12, further comprising tuning a power ratio between the first tone and the second tone.

18. A method for multitone tuning, the method comprising:

lighting a plasma in a plasma processing system with a multitone signal;

controlling a fundamental frequency of the multitone signal;

monitoring a full bandwidth of a feedback signal of the plasma processing system;

shifting the fundamental frequency in response to analysis of the feedback signal; and after determining that the fundamental frequency is at a desired frequency, maintaining the fundamental frequency of the multitone signal while set conditions of the plasma are unchanged and monitoring the feedback signal for changes.

19. The method of claim 18, wherein the feedback signal is frequency resolved.

20. The method of claim 18, wherein shifting the fundamental frequency in response to analysis of the feedback signal comprises setting the fundamental frequency to be a frequency with minimum reflected power in the feedback signal.

* * * * *